US012696563B2

(12) United States Patent
Lee et al.

(10) Patent No.: US 12,696,563 B2
(45) Date of Patent: Jul. 28, 2026

(54) IMAGE SENSOR

(71) Applicant: Samsung Electronics Co., Ltd.,
Suwon-si (KR)

(72) Inventors: Kwang-Min Lee, Suwon-si (KR);
Kisang Yoon, Suwon-si (KR)

(73) Assignee: Samsung Electronics Co., Ltd.,
Gyeonggi-do (KR)

( * ) Notice: Subject to any disclaimer, the term of this
patent is extended or adjusted under 35
U.S.C. 154(b) by 454 days.

(21) Appl. No.: 18/455,255

(22) Filed: Aug. 24, 2023

(65) Prior Publication Data

US 2024/0243144 A1 Jul. 18, 2024

(30) Foreign Application Priority Data

Jan. 17, 2023 (KR) ........................ 10-2023-0006957

(51) Int. Cl.
| | |
|---|---|
| *H10F 39/00* | (2025.01) |
| *G02B 1/116* | (2015.01) |
| *H10F 39/18* | (2025.01) |

(52) U.S. Cl.
CPC ........... *H10F 39/805* (2025.01); *G02B 1/116*
(2013.01); *H10F 39/024* (2025.01); *H10F*
*39/182* (2025.01); *H10F 39/8053* (2025.01);
*H10F 39/8063* (2025.01); *H10F 39/807*
(2025.01); *H10F 39/809* (2025.01); *H10F*
*39/811* (2025.01)

(58) Field of Classification Search
CPC .... H10F 39/805; H10F 39/024; H10F 39/182;
H10F 39/8053; H10F 39/8063; H10F
39/807; H10F 39/809; H10F 39/811;
H10F 39/199; H10F 39/8023; H10F
39/806; H10F 39/18; H10F 39/802; G02B
1/116
See application file for complete search history.

(56) References Cited

U.S. PATENT DOCUMENTS

| | | | |
|---|---|---|---|
| 8,183,603 B2 | 5/2012 | Yamaguchi et al. | |
| 8,981,517 B2 | 3/2015 | Oshiyama et al. | |
| 9,373,656 B2 | 6/2016 | Park | |
| 9,520,430 B2 | 12/2016 | Mizuta et al. | |

(Continued)

FOREIGN PATENT DOCUMENTS

| | | |
|---|---|---|
| JP | 2022055214 A | 4/2022 |
| KR | 20140147508 A | 12/2014 |

(Continued)

*Primary Examiner* — Tucker J Wright
(74) *Attorney, Agent, or Firm* — HARNESS, DICKEY &
PIERCE, P.L.C.

(57) ABSTRACT

Provided is an image sensor, which includes a first substrate
that has a first surface and a second surface opposite to the
first surface, and includes a pixel array area and an edge
area, the edge area including a first conductive pad; an
anti-reflection structure on the second surface; a pixel iso-
lator in the first substrate and defining and separating pixels;
and a micro lens array that is disposed on the anti-reflection
structure, in which the anti-reflection structure includes a
first insulating layer, a conductive layer, a second insulating
layer, and a third insulating layer sequentially stacked, the
conductive layer is on the pixel array area, and is not at least
in a portion of the edge area where the first conductive pad
is arranged, and a voltage is configured to be applied to the
conductive layer.

20 Claims, 18 Drawing Sheets

(56) References Cited

U.S. PATENT DOCUMENTS

| | | | |
|---|---|---|---|
| 9,954,021 | B2 | 4/2018 | Yamaguchi et al. |
| 11,205,672 | B2 | 12/2021 | Oh et al. |
| 2007/0210395 | A1 | 9/2007 | Maruyama et al. |
| 2014/0374868 | A1 | 12/2014 | Lee et al. |
| 2015/0255495 | A1 | 9/2015 | Park |
| 2015/0357359 | A1* | 12/2015 | Ikariyama ............ H10F 39/805 |
| | | | 438/72 |
| 2017/0104024 | A1 | 4/2017 | Yamaguchi et al. |
| 2019/0267415 | A1 | 8/2019 | Oh et al. |
| 2020/0083268 | A1 | 3/2020 | Kim et al. |
| 2022/0037385 | A1 | 2/2022 | Bang et al. |
| 2022/0093657 | A1 | 3/2022 | Jo et al. |
| 2022/0238571 | A1 | 7/2022 | Park et al. |

FOREIGN PATENT DOCUMENTS

| | | |
|---|---|---|
| KR | 20220014951 A | 2/2022 |
| KR | 20220106901 A | 8/2022 |

* cited by examiner

FIG. 2

IMAGE SENSOR

CROSS-REFERENCE TO RELATED APPLICATION

This application claims priority to and the benefit of Korean Patent Application No. 10-2023-0006957 filed in the Korean Intellectual Property Office on Jan. 17, 2023, the entire contents of which are incorporated herein by reference.

BACKGROUND

Various embodiments relate to an image sensor.

An image sensor is or includes a semiconductor device that converts an optical image into an electrical signal. The image sensor may be classified into a charge coupled device (CCD) type and a complementary metal oxide semiconductor (CMOS) type. The CMOS type image sensor may be abbreviated as a CMOS image sensor (CIS). The CIS includes a plurality of pixels two-dimensionally arranged. Each of the pixels includes a photodiode (PD). The photodiode serves to convert incident light into an electrical signal.

SUMMARY

Various embodiments may provide an image sensor having advantages of implementing clear image quality.

Problems to be solved by the present disclosure are not limited to the above-mentioned aspects. For example, other aspects that are not described may be understood by those of ordinary skill in the art from the following specification.

Various embodiments may provide an image sensor, including: a first substrate having a first surface and a second surface opposite to the first surface, and includes a pixel array area and an edge area on which a first conductive pad is disposed; an anti-reflection structure on the second surface; a pixel isolator in the first substrate defining and separating pixels; and a micro lens array on the anti-reflection structure. The anti-reflection structure includes a first insulating layer, a conductive layer, a second insulating layer, and a third insulating layer sequentially stacked, the conductive layer on the pixel array area, and is not located at least in a portion of the edge area where the first conductive pad is disposed, and a voltage is configured to be applied to the conductive layer.

Alternatively or additionally, various embodiments may provide an image sensor, including: a first substrate having a first surface and a second surface opposite to the first surface, and including a pixel array area and an edge area; an anti-reflection structure on the second surface; a pixel isolator on the first substrate defining and separating pixels; a color filter on the anti-reflection structure; a micro lens array on the color filter; a first interlayer insulating layer on the first surface of the first substrate; a first wire layer within the first interlayer insulating layer; a second interlayer insulating layer under the first interlayer insulating layer; a second wire layer within the second interlayer insulating layer; a second substrate under the second interlayer insulating layer; a contact on the second surface of the first substrate in the edge area; a conductive pad on the second surface of the first substrate in the edge area and at a position farther from the pixel array area than the contact; and first and second vias passing through portions of the first substrate, the first interlayer insulating layer, and the second interlayer insulating layer in the edge area and contact at least one of the first wire layer and the second wire layer. The anti-reflection structure includes a first insulating layer, a titanium oxide layer, a conductive layer, a second insulating layer, and a third insulating layer sequentially stacked, and an edge of the titanium oxide layer is between the contact and the conductive pad, and the titanium oxide layer is electrically connected to the contact.

Alternatively or additionally, various embodiments may provide an image sensor, including: a first substrate having a first surface and a second surface opposite to the first surface, and including a pixel array area and an edge area; an anti-reflection structure is disposed on the second surface; a pixel isolator on the first substrate defining and separating pixels; a color filter on the anti-reflection structure; a micro lens array on the color filter; a first interlayer insulating layer on the first surface of the first substrate; a first wire layer within the first interlayer insulating layer; a second interlayer insulating layer under the first interlayer insulating layer; a second wire layer within the second interlayer insulating layer; a second substrate under the second interlayer insulating layer; and a first conductive pad and a second conductive pad that are on the second surface of the first substrate in the edge area. The anti-reflection structure includes a first insulating layer, a titanium oxide layer, a conductive layer, a second insulating layer, and a third insulating layer sequentially stacked, the titanium oxide layer includes a main body part having an edge between the pixel array area and the first conductive pad and a connection part connecting between the main body part and the second conductive pad.

The connection part may be electrically connected to the second conductive pad.

According to various embodiments, it may be possible to improve dark characteristics of an image sensor by applying a voltage, such as a predetermined voltage, to a conductive layer of an anti-reflection structure of an image sensor.

According to various embodiments, by removing a conductive layer of an anti-reflection structure from an edge area of an image sensor, it may be possible to prevent or reduce a leakage current generated due to connection or soft short between a conductive layer and adjacent back contacts, back vias, and/or back conductive pads. As a result, it may be possible to prevent or reduce operation errors of the image sensor, and to realize a more clear image quality.

Alternatively or additionally according to various embodiments, the anti-reflection structure of the image sensor includes a titanium oxide layer that is a conductive layer, and the titanium oxide layer reduces reflectivity of light of all colors as a whole, and in particular, it may be possible to further reduce reflectivity of blue light. As a result, it may be possible to increase quantum efficiency (QE) of a blue pixel.

BRIEF DESCRIPTION OF THE DRAWINGS

FIG. 2 is a circuit diagram of an active pixel sensor array of an image sensor according to various embodiments.

DETAILED DESCRIPTION OF VARIOUS EMBODIMENTS

Figure 1:
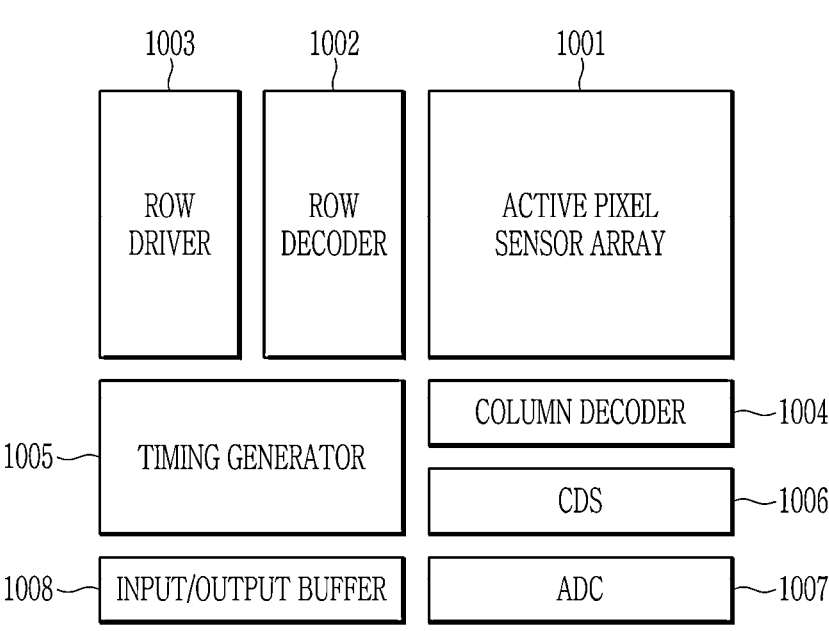
FIG. 1 is a block diagram for describing an image sensor according to various embodiments.

Inventive concepts may be described more fully hereinafter with reference to the accompanying drawings, in which embodiments of the invention are shown. The described embodiments may be modified in various different ways, all without departing from the spirit or scope of inventive concepts.

The drawings and descriptions are to be regarded as illustrative in nature and not limiting. Same reference numerals denote same constituent elements throughout the specification.

In the drawings, sizes and thicknesses of each component may be arbitrarily shown for convenience of description, and embodiments are not necessarily limited to those shown in the drawings. In the drawings, thicknesses of layers, films, plates, regions, etc., may be exaggerated for clarity. In the drawings, thicknesses of some layers and regions may be exaggerated for convenience of description.

The singular forms used herein are intended to include the plural forms as well, unless the context clearly dictates otherwise.

In the specification and claims, the term "and/or" is intended to include any combination of the terms "and" and "or" for its meaning and interpretation. For example, "A and/or B" may be understood to mean "A, B, or A and B."

The phrase "at least one of" in the specification and claims is intended to include "~at least one selected from the group of" for purposes of meaning and interpretation. For example, at least one of "A and/or B" may be understood to mean "A, B, or, A and B."

Terms such as first and second may be used herein to describe various components, but these components are not limited by these terms. These terms are only used to distinguish one element from another. For example, a first component may be referred to as a second component, and similarly, the second component may be referred to as the first component, without departing from the scope of the present disclosure.

When an element such as a layer, a film, a region, or a substrate is referred to as being "on" another element, it may be directly on the other element or have an intermediate element therebetween. In contrast, when an element is referred to as being "directly on" another element, there are no intermediate elements. In addition, the term "above" of the target element throughout the specification should be understood as being located above or under the target element, and does not necessarily mean 'above' with respect to the opposite direction of gravity.

For example, the spatially relative terms "below", "above", etc., may be used to facilitate describing the relationship between one element or component and another element or component as illustrated in the drawings. The spatially relative terms are intended to include other directions in a device in use or operation in addition to the directions illustrated in the drawings. For example, when a device illustrated in the drawing is turned over, a device located "below" another device may be located "above" the other device. Accordingly, the example term "below" may include both lower and upper positions. Devices may also be oriented in different directions, so spatially relative terms may be interpreted differently depending on directions.

When an element (or region, layer, portion, etc.) is referred to as "connected" or "coupled" to another element in the specification, it is directly connected, or coupled to the other element described above, or intervening elements are present therebetween.

The terms "~connected to" or "~coupled to" may include a physical or electrical connection or coupling.

Unless defined otherwise, all terms (including technical and scientific terms) used herein have the same meaning as generally understood by one of ordinary skill in the art to which the present disclosure belongs. Terms such as those defined in generally used dictionaries are to be interpreted as having a meaning consistent with their meaning in the context of the relevant art, and should not be in an idealized or overly formal sense unless expressly defined herein.

FIG. 1 is a block diagram for describing an image sensor according to various embodiments.

Referring to FIG. 1, an image sensor may include an active pixel sensor array 1001, a row decoder 1002, a row driver 1003, a column decoder 1004, a timing generator 1005, a correlated double sampler (CDS) 1006, an analog to digital converter (ADC) 1007, and an input/output buffer (I/O buffer) 1008. Each of the active pixel sensor array 1001, the row decoder 1002, the row driver 1003, a column decoder 1004, the timing generator 1005, the correlated double sampler 1006, the ADC 1007, and the I/O buffer 1008 may communicate with others thereof, to engage in one-way or two-way or multi-way communication, to exchange data such as information and/or commands, in various manners such as serially and/or in a parallel manner. The data may be analog and/or digital.

The active pixel sensor array 1001 may include a plurality of unit pixels two-dimensionally arranged, and may convert an optical signal into an electrical signal. The active pixel sensor array 1001 may be driven by a plurality of driving signals, such as a pixel selection signal, a reset signal, and a charge transfer signal, from the row driver. In some embodiments, the converted electrical signal may be provided to the correlated double sampler 1006.

The row driver 1003 may provide a plurality of driving signals for driving a plurality of unit pixels to the active pixel sensor array 1001 according to a result decoded by the row decoder 1002. When the unit pixels are arranged in a matrix form such as a rectangular or square form, the driving signals may be provided to each row.

The timing generator 1005 may provide a timing signal and a control signal to the row decoder 1002 and the column decoder 1004.

The correlated double sampler (CDS) 1006 may receive the electrical signal generated from the active pixel sensor array 1001 and may hold and sample the electrical signal. The correlated double sampler 1006 may double sample a specific noise level and a signal level due to the electrical signal, and output a difference level corresponding to a difference between the noise level and the signal level.

The analog-to-digital converter (ADC) 1007 may convert an analog signal corresponding to the difference level output from the correlated double sampler 1006 into a digital signal, and may output the digital signal.

The input/output buffer 1008 may latch digital signals, and the latched signals may sequentially output digital signals to an image signal processing unit (not illustrated) according to decoding results in the column decoder 1004.

Figure 2:
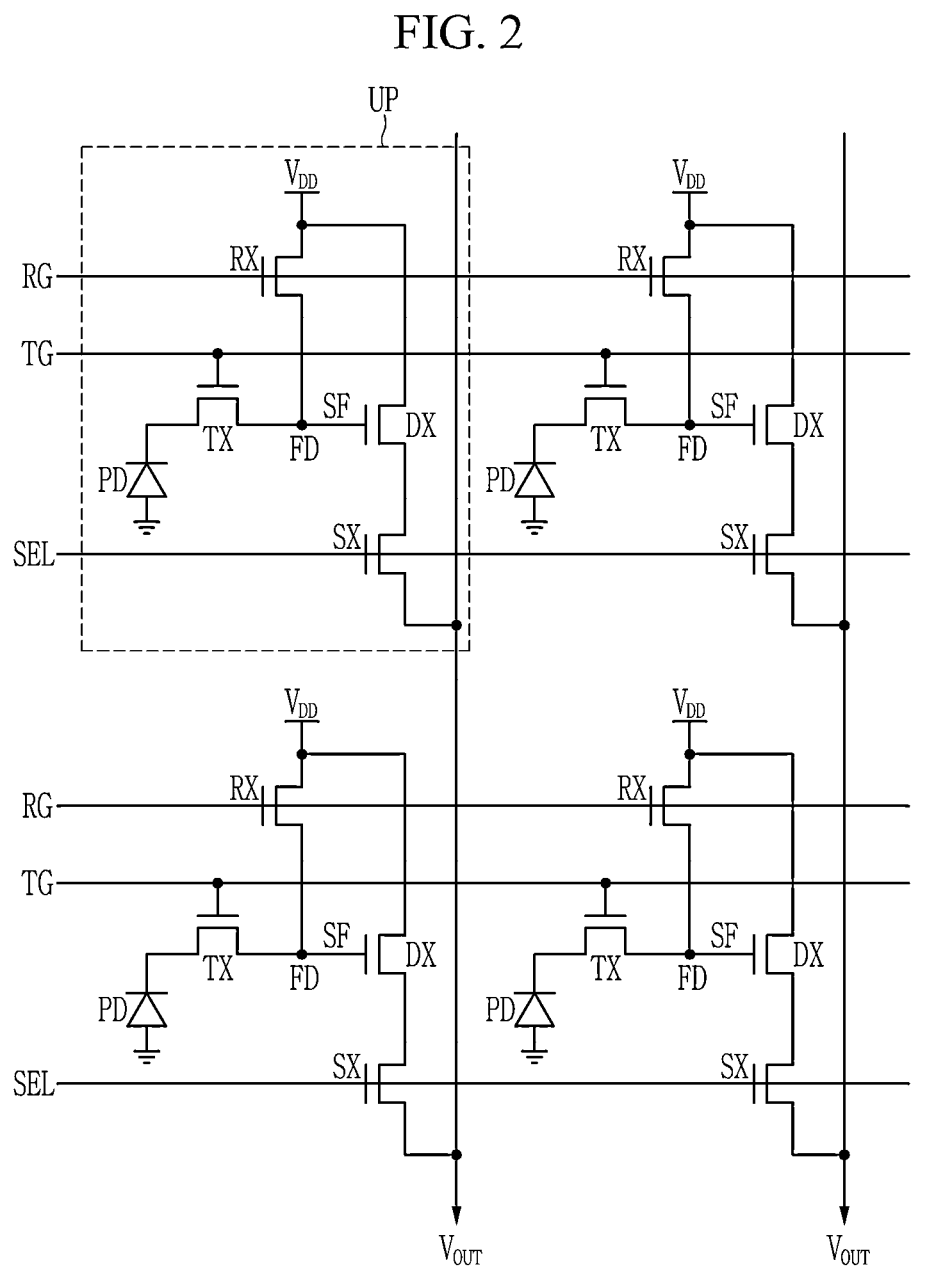

FIG. 2 is a circuit diagram of an active pixel sensor array of an image sensor according to various embodiments.

Referring to FIGS. 1 and 2, the active pixel sensor array 1001 may include a plurality of unit pixels UP, in which the unit pixels UP are arranged in a matrix form. Each unit pixel UP may include a transfer transistor TX. Each unit pixel UP may further include logic transistors RX, SX, and DX. The logic transistor may be a reset transistor RX, a select transistor SX, or a source-follower transistor DX. The transfer transistor TX may include a transfer gate TG. Each unit pixels UP may further include a photoelectric converter PD and a floating diffusion region FD. The logic transistors RX, SX, and DX may share between the plurality of unit pixels UP.

Each of the transistors TX, RX, SX, and DX may be NMOS transistors; however, embodiments are not limited thereto, and at least one of the transistors TX, RX, SX, and DX may be PMOS transistors. Alternatively or additionally, each of the transistors TX, RX, SX, and DX may have the same, or at least one may have a different, electrical and/or physical characteristic. For example, there may be the same or different threshold voltages, drive currents, and/or leakage characteristics among the transistors TX, RX, SX, and DX. Alternatively or additionally, there may be the same or different gate lengths and/or gate widths and/or gate oxide thicknesses among the transistors TX, RX, SX, and DX.

The photoelectric converter PD may generate and accumulate photocharges in proportion to the amount of light incident from the outside. The photoelectric converter PD may be or include or be included in a photodiode, a photo transistor, a photo gate, a pinned photodiode and combination thereof. The transfer transistor TX may transmit charge generated from the photoelectric converter PD to the floating diffusion region FD. The floating diffusion region FD may receive and accumulatively store charges generated from the photoelectric converter PD. The source-follower transistor DX may be controlled according to the amount of photo charges accumulated in the floating diffusion region FD.

The reset transistor RX may periodically reset charges accumulated in the floating diffusion region FD. A drain electrode of the reset transistor RX may be connected to the floating diffusion region FD, and a source electrode may be connected to a power source voltage $V_{DD}$. When the reset transistor RX is turned on, the power source voltage $V_{DD}$ connected to the source electrode of the reset transistor RX may be applied to the floating diffusion region FD. Therefore, when the reset transistor RX is turned on, the charges accumulated in the floating diffusion region FD may be discharged, and thus, the floating diffusion region FD may be reset.

The source-follower transistor DX including a source-follower gate SF may serve as a source-follower buffer amplifier. The source-follower transistor DX may amplify a change in potential in the floating diffusion region FD, and output the amplified potential to an output line $V_{out}$.

The select transistor SX including a select gate SEL may select the unit pixels UP to be read in a row unit. When the select transistor SX is turned on, the power source voltage $V_{DD}$ may be applied to the drain electrode of the source-follower transistor DX.

Figure 3:
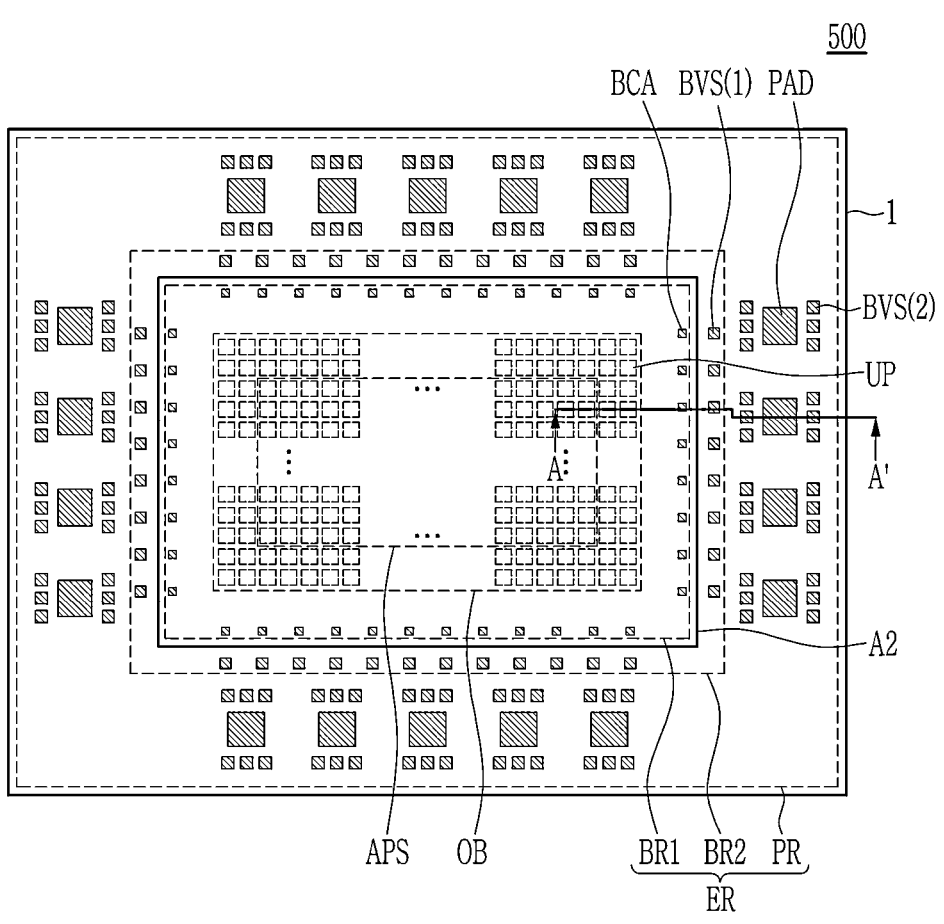
FIG. 3 is a plan view of an image sensor according to various embodiments.
Figure 4:
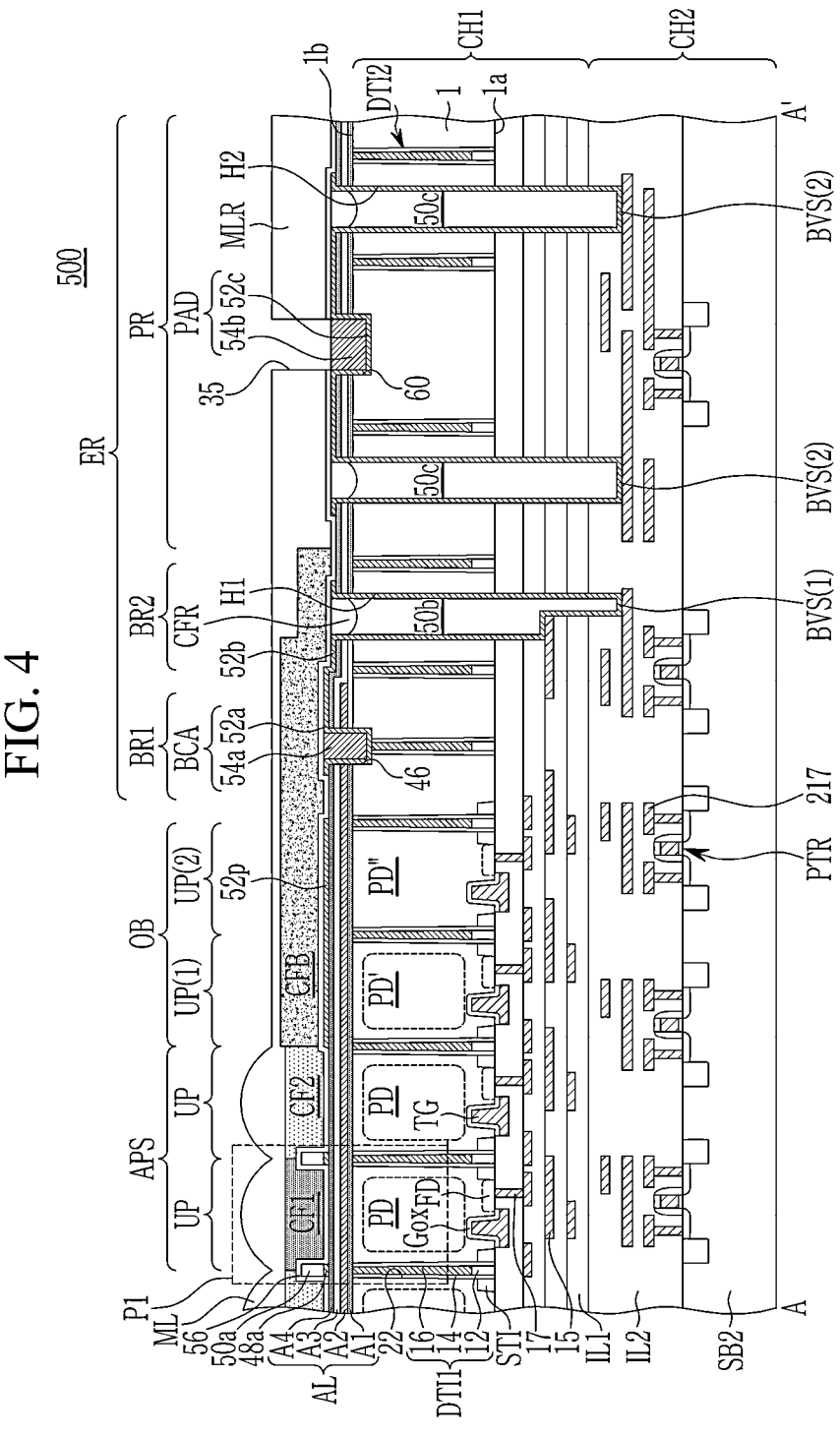
FIG. 4 is a cross-sectional view taken along line A-A' of FIG. 3.
Figure 5:
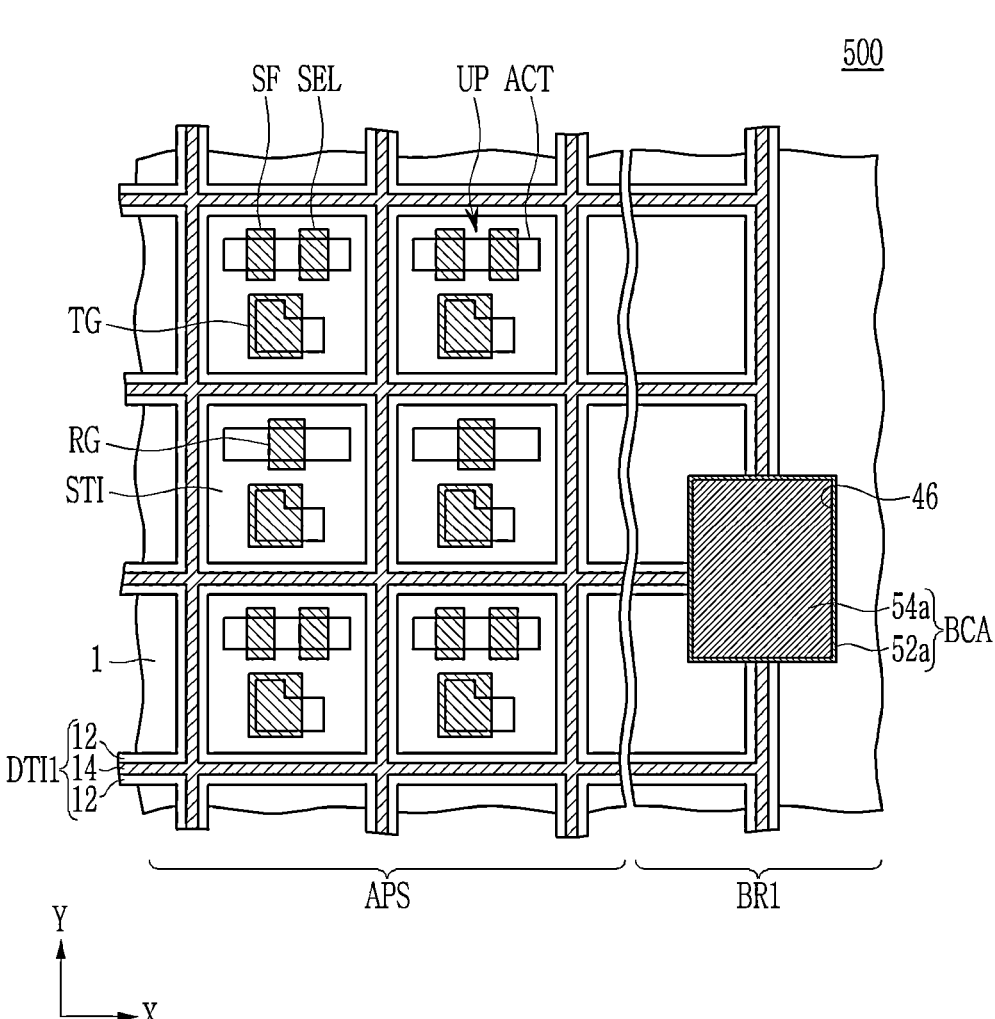
FIG. 5 is a partial plan view of an image sensor of FIG. 3.
Figure 6:
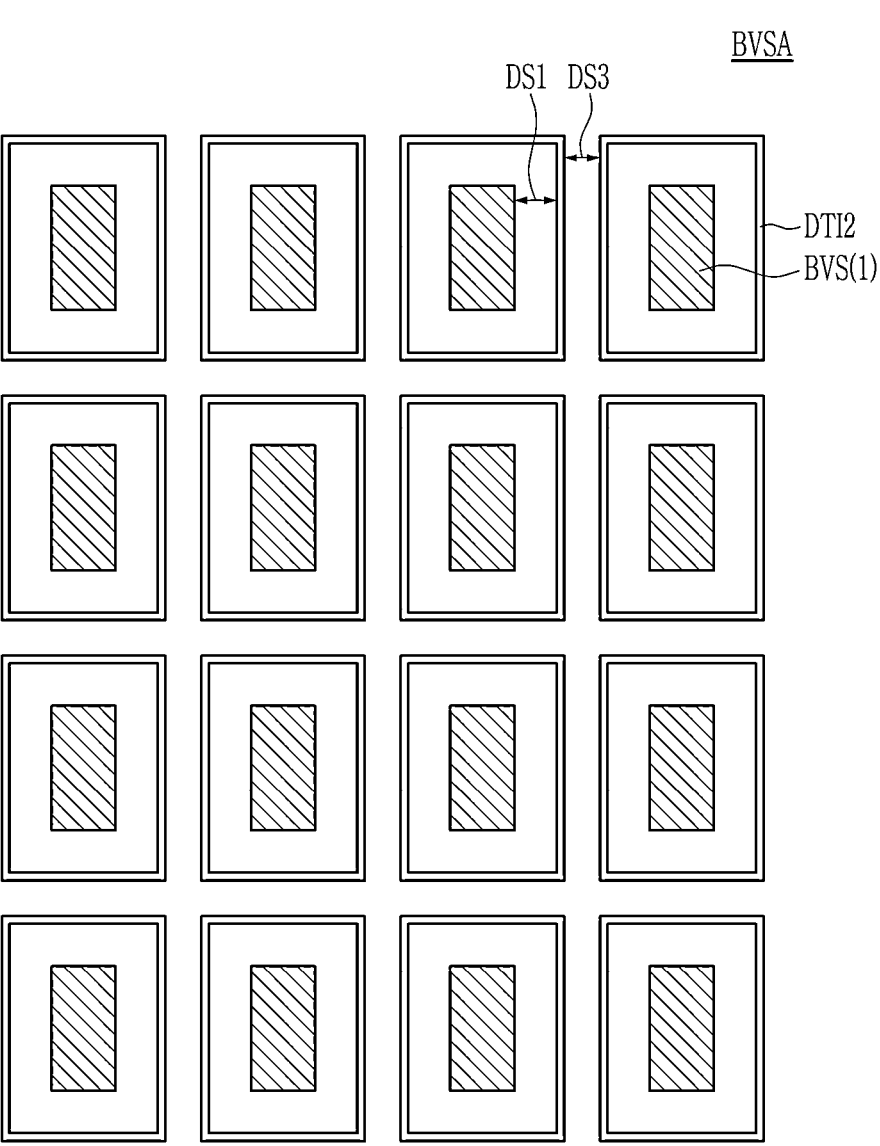
FIG. 6 is a plan view of a via array arranged in a via area of FIG. 3.
Figure 7:
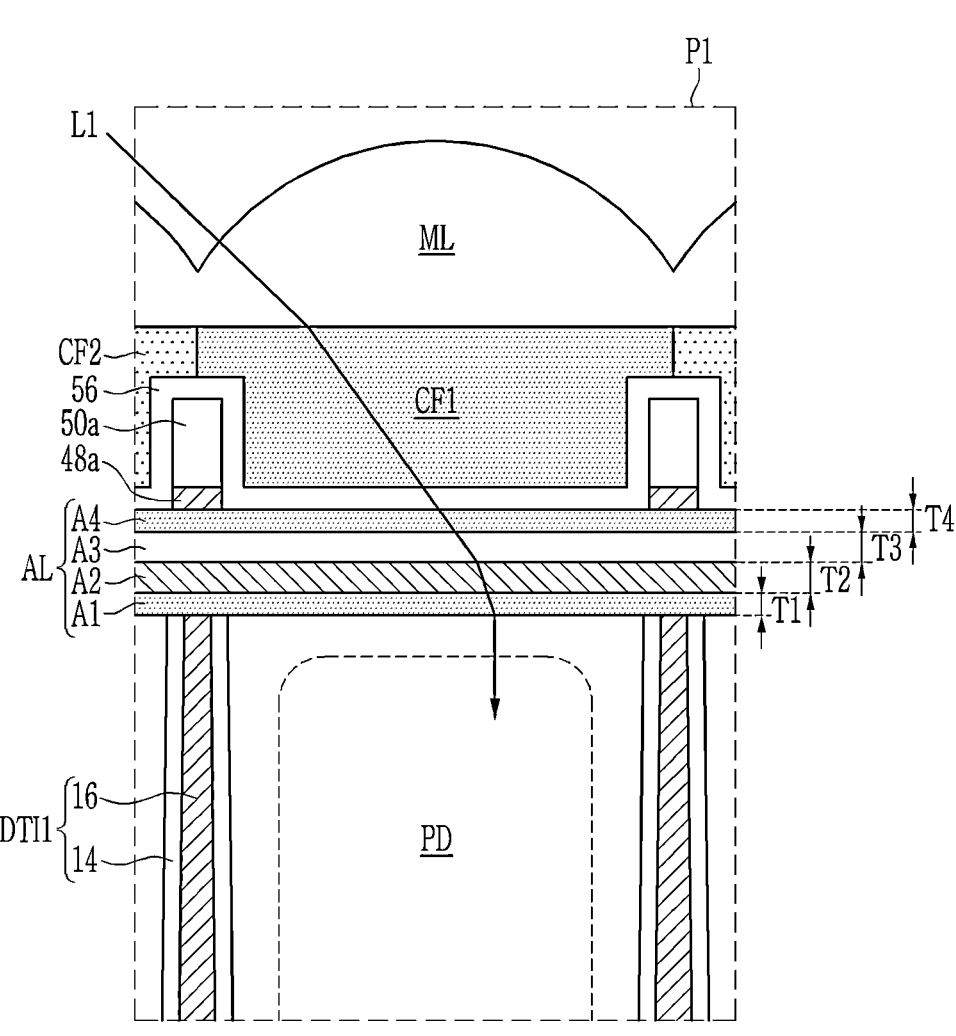
FIG. 7 is an enlarged view of portion 'P1' of FIG. 4.

FIG. 3 is a plan view of an image sensor according to various embodiments. FIG. 4 is a cross-sectional view taken along line A-A' of FIG. 3. FIG. 5 is a partial plan view of an image sensor of FIG. 3. FIG. 6 is a plan view of a via array arranged in a via area of FIG. 3. FIG. 7 is an enlarged view of portion 'P1' of FIG. 4.

Referring to FIGS. 3 and 4, an image sensor 500 according to various embodiments may include a structure in which first and second sub-chips CH1 and CH2 are bonded. A first sub-chip CH1 may be disposed on a second sub-chip CH2. The first sub-chip CH1 includes a first substrate 1. The first substrate 1 may be or may include, for example, a silicon single crystal wafer, a silicon epitaxial layer, or a silicon on insulator (SOI) substrate. The first substrate 1 may be doped with impurities of a first conductivity type, for example. For example, the first conductivity type may be a P type and may include boron dopants. The first substrate 1 includes a front surface 1a and a rear surface 1b opposite to each other. As used below, the front surface 1a may be referred to as a first surface 1a and the rear surface 1b may be referred to as a second surface 1b. The first substrate 1 may include a pixel array area APS, an optical black area OB, and an edge area ER.

The pixel array area APS and the optical black area OB may each include the plurality of unit pixels UP. The optical black area OB may surround the pixel array area APS. The edge area ER may surround the pixel array area APS and the optical black area OB. The edge area ER may include a contact area BR1, a via area BR2, and a pad area PR. The via area BR2 may be located between the contact area BR1 and the pad area PR. The pad area PR may be located at the outermost side of the edge area ER.

The first pixel isolator DTI1 may be disposed within the first substrate 1 in the pixel array area APS and the optical black area OB, and may separate or limit or define the unit pixels UP. The first pixel isolator DTI1 may extend to the contact area BR1 of the edge area ER. The first pixel isolator DTI1 may have a mesh shape in plan view Back contacts BCA, back vias BVS, and back conductive pads PAD may be disposed on the rear surface 1b of the first substrate 1 in the edge area ER. Referring to FIGS. 4 to 6, the second pixel isolator DTI2 may surround the back vias BVS from a planar perspective, respectively. The back vias BVS may include first back vias BVS(1) and second back vias BVS(2).

The first pixel isolators DTI1 and the second pixel isolators DTI2 may respectively be located in a deep trench 22 formed from the front surface 1a of the first substrate 1 toward the rear surface 1b. Either or both of the first pixel isolator DTI1 and the second pixel isolators DTI2 may be a frontside deep trench isolation FDTI. The first pixel isolator DTI1 and the second pixel isolations DTI2 may each include a buried insulating pattern 12, an isolation insulating pattern 14, and an isolation conductive pattern 16. The buried insulating pattern 12 may be interposed between the isolation conductive pattern 16 and the first interlayer insulating layer IL. The isolation insulating pattern 14 may be interposed between the isolation conductive pattern 16 and the first substrate 1 and between the buried insulating pattern 12 and the first substrate 1.

The buried insulating pattern 12 and the isolation insulating pattern 14 may be made of (e.g., may be formed of or include) an insulating material having a refractive index different from that of the first substrate 1. The buried insulating pattern 12 and the isolation insulating pattern 14 may include, for example, silicon oxide. The isolation conductive pattern 16 may be spaced apart from the first substrate 1. The isolation conductive pattern 16 may include a doped polysilicon layer or a doped silicon germanium layer, e.g. a layer doped with impurity. The impurity doped on the polysilicon or silicon germanium layer may be, for example, one of (or at least one of) boron, phosphorous, and arsenic. In some embodiments, the isolation conductive pattern 16 may include a metal layer.

Each of the first pixel isolator DTI1 and the second pixel isolators DTI2 may have a narrower horizontal cross-sectional area from the front surface 1a toward the rear surface 1b of the first substrate 1 as illustrated in FIG. 4. The second pixel isolator DTI2 may also be referred to as a "substrate isolator."

In the unit pixels UP, the photoelectric converters PD may each be disposed in the first substrate 1. The photoelectric converters PD may be doped with impurities of a second conductivity type opposite to those of the first conductivity type. The second conductivity type may be, for example, an N-type such as but not limited to phosphorus or arsenic. The N-type impurities doped in the photoelectric converter PD form a PN junction with P-type impurities doped in the first substrate 1 therearound to provide a photodiode.

Device isolators STI adjacent to the front surface 1a may be disposed in the first substrate 1. The device isolators STI may be penetrated by the first pixel isolator DTI1. The device isolators STI may separate or limit or define active areas ACT adjacent to the front surface 1a in each unit pixel UP. The active area ACT may be provided for the transistors TX, RX, DX, and SX of FIG. 2.

Referring to FIG. 4, a transfer gate TG may be disposed on the front surface 1a of the first substrate 1 in each unit pixel UP. A portion of the transfer gate TG may extend into the first substrate 1. The transfer gate TG may be of a vertical type. Alternatively, the transfer gate TG may be of a planar type that does not extend into the first substrate 1 and has a flat shape. A gate insulating layer Gox may be interposed between the transfer gate TG and the first substrate 1. A floating diffusion region FD may be disposed within the first substrate 1 on one side of the transfer gate TG. The floating diffusion region FD may be doped with impurities of the second conductivity type, for example.

The image sensor 500 may be or may include or be included in an image sensor receiving light through rear surface. Light may be incident into the first substrate 1 through the rear surface 1b of the first substrate 1. Electron-hole pairs may be generated in the PN junction by the incident light. Electrons thus generated may move to or be swept to the photoelectric converter PD. When a voltage is applied to the transfer gate TG, the electrons may move to the floating diffusion region FD.

As illustrated in FIG. 5, a reset gate RG may be disposed adjacent to the transfer gate TG on the front surface 1a in one of the unit pixels UP. In another one of the unit pixels UP, a source-follower gate SF and a select gate SEL may be disposed adjacent to the transfer gate TG on the front surface 1a. The gates TG, RG, SF, and SEL may respectively correspond to the gates of the transistors TX, RX, DX, and SX of FIG. 2. The gates TG, RG, SF, and SEL may overlap the active areas ACT. In the present embodiment, the reset transistor RX, the select transistor SX, and the source-follower transistor DX may be shared between two adjacent unit pixels UP.

The first unit pixel UP(1) and the second unit pixel UP(2) may be arranged in the optical black area OB of the first substrate 1. In the first unit pixel UP(1), a black photoelectric converter PD' is provided in the first substrate 1. In the second unit pixel UP(2), a dummy area PD" may be provided in the first substrate 1. The black photoelectric converter PD' may be doped with, for example, the impurities of the second conductivity type that is different from those of the first conductivity type. The second conductivity type may be, for example, an N-type such as but not limited to phosphorus or arsenic. The pixel array area APS may include the plurality of unit pixels UP.

The black photoelectric converter PD' has a similar structure to that of the photoelectric converter PD, but may not perform the same operation (for example, an operation of receiving light and generating an electrical signal) as the photoelectric converter PD. The dummy area PD" may not be doped with impurities.

The signal generated in the dummy area PD" may be used as information for removing process noise thereafter The first sub-chip CH1 further includes first interlayer insulating layers IL1 disposed on the front surface 1a. The first interlayer insulating layers IL1 may be formed as or may be made as or may include a multilayer of at least one layer selected from a silicon oxide layer, a silicon nitride layer, a silicon oxynitride layer, and a porous low-k dielectric layer. First wires 15 may be disposed between or within the first interlayer insulating layers IL1. The floating diffusion region FD may be connected to the first wires 15 through a first contact plug 17. The first contact plug 17 may penetrate through the first interlayer insulating layer IL1 closest (lowest layer) to the front surface 1a among the first interlayer insulating layers IL1 in the pixel array area APS.

The second sub-chip CH2 may include a second substrate SB2, peripheral transistors PTR disposed thereon, and second interlayer insulating layers IL2 covering them. Second wires 217 may be disposed in the second interlayer insulating layers IL2. The second sub-chip CH2 may include circuits for storing electrical signals generated in the first sub-chip CH1. Although FIG. 4 illustrates that the peripheral transistors PTR are extending in one horizontal direction, embodiments are not limited thereto, and in some embodiments, the peripheral transistors PTR may extend in another horizontal direction in addition to or alternatively to the direction illustrated in FIG. 4.

Referring to FIGS. 4 and 7, an anti-reflection structure AL may be disposed on the rear surface 1b of the first substrate 1. The anti-reflection structure AL may include a first insulating layer A1, a conductive layer A2, a second insulating layer A3, and a third insulating layer A4 sequentially stacked. The first insulating layer A1, the second insulating layer A3, and the third insulating layer A4 may each include different materials, and may or may not include any common material. In various embodiments, the first insulating layer A1 may include aluminum oxide and may not include hafnium oxide or silicon oxide, the second insulating layer A3 may include silicon oxide and may not include hafnium oxide or aluminum oxide, and the third insulating layer A4 may include hafnium oxide and may not include silicon oxide or aluminum oxide. The conductive layer A2 may be a layer having electrical conductivity and include titanium oxide.

As used herein, the first insulating layer A1 is referred to as a "first anti-reflection layer," the conductive layer A2 may be referred to as a "second anti-reflection layer," or a "titanium oxide layer," the second insulating layer A3 may be referred to as a "third anti-reflection layer," and the third insulating layer A4 may be referred to as a "fourth anti-reflection layer."

The first substrate 1 may have a first refractive index n1, the first insulating layer A1 may have a second refractive index n2, the conductive layer A2 may have a third refractive index n3, and the second insulating layer A3 may have a fourth refractive index n4. An average value or a mean value $\{(n2+n3)/2\}$ of the second refractive index n2 and the third refractive index n3 may be smaller than the first refractive index n1 and greater than the fourth refractive index n4. The first refractive index n1 may be 4.0 to 4.4. The second refractive index n2 may be 2.0 to 3.0. The third refractive index n3 may be 2.2 to 2.8. The fourth refractive index n4 may be 1.0 to 1.9.

As illustrated in FIG. 7, the first insulating layer A1 may have a first thickness T1, the conductive layer A2 may have a second thickness T2, the second insulating layer A3 may have a third thickness T3, and the third insulating layer A4 may have a fourth thickness T4. In this case, the second thickness T2 may be larger than each of the first thickness T1 and the fourth thickness T4 and smaller than the third thickness T3.

The first thickness T1 may range from 10 Å to 100 Å. The second thickness T2 may range from 100 Å to 600 Å. The third thickness T3 may be 600 Å to 900 Å. The fourth thickness T4 may be 20 Å to 200 Å.

By the relationship between the refractive indices and/or the relationship between the thicknesses, as illustrated in FIG. 7, light L1 incident on a micro lens ML is refracted and passes through the multi-layered structure of the anti-reflection structure AL, and thus, may be or may be more likely to be well incident on the photoelectric converter PD. Accordingly, it may be possible to provide the image sensor 500 having clear image quality by increasing the light reception rate.

In the image sensor 500 according to some example embodiment, the anti-reflection structure AL may include the conductive layer A2 made of or including titanium oxide TiO2, and the conductive layer A2 made of the titanium oxide TiO2 or including may reduce the reflectivity of all color light as a whole and in particular, further reduce reflectivity of blue light. As a result, it may be possible to increase quantum efficiency (QE) of a blue pixel.

Alternatively or additionally, the first insulating layer A1 may also serve as a negative fixed charge layer. As a result, it may be possible to improve a dark current and/or a white spot.

Alternatively or additionally, a negative potential such as a dynamically determined or predetermined negative potential (voltage) may be applied to the conductive layer A2, so holes may be accumulated in the vicinity of the rear surface 1*b* of the first substrate 1. As a result, it may be possible to further improve the dark current and the white spot.

Referring to FIGS. 3 and 4, back contacts BCA may be disposed on the rear surface 1*b* of the first substrate 1 in the contact area BR1. In the via area BR2, first back vias BVS(1) may be arranged on the rear surface 1*b* of the first substrate 1. In the pad area PR, the back conductive pads PAD and second back vias BVS(2) may be arranged on the back surface 1*b* of the first substrate 1. The second back vias BVS(2) may be grouped with a predetermined number and arranged around the back conductive pads PAD, respectively Referring to FIGS. 3 and 4, the first insulating layer A1, the second insulating layer A3, and the third insulating layer A4 may be disposed over the pixel array area APS, the optical black area OB, and the edge area ER. However, the conductive layer A2 may be disposed in the pixel array area APS, the optical black area OB, the contact area BR1, and even a portion of the via area BR2, and may not be disposed in the pad area PR outside thereof. Accordingly, the conductive layer A2 may be in contact with and electrically connected to the back contacts BCA, and may be electrically isolated from the second back vias BVS(2) and the pads PAD. In some embodiments, the first insulating layer A1 may also be removed in the areas where the conductive layer A2 is not disposed.

In some embodiments as illustrated, the conductive layer A2 is not disposed in the via area BR2 where the first back vias BVS(1) are located, but the conductive layer A2 may be disposed in the via area BR2 in some embodiments, so the conductive layer A2 may be in contact with and be electrically connected to the first back vias BVS(1).

As such, the conductive layer A2 may be electrically connected to the back contacts BCA and/or the first back vias BVS(1) and receive a negative potential such as a dynamically determined or predetermined negative potential therethrough. In this case, the potential applied to the conductive layer A2 may be the potential applied to the first pixel isolator DTI1.

The arrangement of the first back vias BVS(1) is not limited to that illustrated in FIG. 3 and may vary. For example, as illustrated in FIG. 6, the first back vias BVS(1) may constitute a back via array BVSA in the via area BR2. For example, the first back vias BVS(1) may be arranged in a particular (or predetermined) number of columns and/or rows. In FIG. 6, a first distance DS1 between one first back via BVS(1) and a second pixel isolator DTI2 adjacent thereto may be greater than a second distance DS3 between adjacent second pixel isolators DTI2. The first distance DS1 may be, for example, 1.5 μm to 2.5 μm. The second distance DS3 may be 0.5 μm to 1.5 μm.

Referring to FIG. 4, the back contacts BCA may penetrate through the anti-reflection structure AL and at least a portion of the first substrate 1. The back contacts BCA may be disposed within the first back trench 46. The back contacts BCA may include a first conductive pattern 52*a* and a first metal pattern 54*a*. The first conductive pattern 52*a* may conformally cover a side surface and a bottom surface of the first back trench 46 and may be in contact with and electrically connected to the conductive layer A2 of the anti-reflection structure AL. The first conductive pattern 52*a* may have a single layer or multi-layer structure of at least one of a titanium layer, a titanium nitride layer, and a tungsten layer. The first metal pattern 54*a* may include aluminum, for example. The first metal pattern 54*a* may fill the first back trench 46.

The back contacts BCA may contact the isolation conductive pattern 16 of the first pixel isolator DTI1. The back contacts BCA may be connected to the first back vias BVS(1) through a back connection wire 52*b* to receive a predetermined negative potential, and may apply the negative potential to the isolation conductive pattern 16 of the first pixel isolator DTI1. The isolation conductive pattern 16 may serve as a common bias line. Through this, holes that may exist on the surface of the first substrate 1 in contact with the first pixel isolator DTI1 may be held, thereby improving dark current characteristics.

The first back vias BVS(1) are each disposed within first holes H1. The first back vias BVS(1) may partially penetrate through the anti-reflection structure AL, the first substrate 1, the first interlayer insulating layer IL1, and the second interlayer insulating layer IL2. The first back vias BVS(1) may connect some of the first wires 15 of the first sub-chip CH1 and some of the second wires 217 of the second sub-chip CH2. The first back vias BVS(1) may fill (e.g. may conformally fill) inner walls and bottom surfaces of the first holes H1. The first back vias BVS(1) may include the same material (e.g., may include exactly the same material) as the first conductive pattern 52a and may have the same thickness as the first conductive pattern 52a. The first back vias BVS(1) may have a single layer or multi-layer structure of at least one of the titanium layer, the titanium nitride layer, and the tungsten layer.

One of the first back vias BVS(1) may be electrically connected to one of the back contacts BCA by one of the back connection wires 52b. The back connection wire 52b may include the same material as the first conductive pattern 52a and may have the same thickness as the first conductive pattern 52a. The back connection wire 52b may have a single layer or multi-layer structure of at least one of the titanium layer, the titanium nitride layer, and the tungsten layer.

The back conductive pad PAD may be disposed within the second back trench 60. The back conductive pad PAD may include a second conductive pattern 52c and a second metal pattern 54b. The second conductive pattern 52c may conformally cover a side surface and a bottom surface of the second back trench 60. The second conductive pattern 52c may include the same material as the first conductive pattern 52a and may have the same thickness as the first conductive pattern 52a. The second conductive pattern 52c may have a single layer or multi-layer structure of at least one of the titanium layer, the titanium nitride layer, and the tungsten layer. The second metal pattern 54b may include aluminum, for example. The second metal pattern 54b may fill the second back trench 60.

The second back vias BVS(2) may each be disposed within second holes H2. The second back vias BVS(2) may partially penetrate through the first insulating layer A1 of the anti-reflection structure AL, the first substrate 1, the first interlayer insulating layer IL1, and the second interlayer insulating layer IL2. The second back vias BVS(2) may be connected to some of the second wires 217. Although not illustrated, the second back vias BVS(2) may be connected to some of the first wires 15. The second back vias BVS(2) may fill or conformally fill inner walls and bottom surfaces of the second holes H2. The second back vias BVS(2) may include the same material as (e.g. exactly the same material as) the first conductive pattern 52a and may have the same thickness as the first conductive pattern 52a. The second back vias BVS(2) may have a single layer or multi-layer structure of at least one of the titanium layer, the titanium nitride layer, and the tungsten layer. One of the second back vias BVS(2) may be electrically connected to one of the back conductive pads PAD by one of the back connection wires 52b.

In some embodiments, by not disposing the conductive layer A2 in the pad region PR, the second back vias BVS(2) and the back conductive pads PAD of the pad region PR can be prevented from contacting the conductive layer A2 and causing unwanted leakage currents. As a result, it may be possible to prevent or reduce the likelihood of an operation error of the image sensor or deterioration of image quality.

A first optical black pattern 52p is disposed on the anti-reflection structure AL in the optical black area OB. The first optical black pattern 52p may include the same material as the first conductive pattern 52a and may have the same thickness as the first conductive pattern 52a. The first optical black pattern 52p may have a single layer or multi-layer structure of at least one of the titanium layer, the titanium nitride layer, and the tungsten layer.

Light blocking grid patterns 48a may be disposed on the anti-reflection structure AL in the pixel array area APS. Low refractive grid patterns 50a may each be disposed on the light blocking grid patterns 48a. The light blocking grid pattern 48a and the low refraction grid pattern 50a overlap the first pixel isolator DTI1 and may have a grid shape in plan view. The light blocking grid pattern 48a may include, for example, at least one of titanium and titanium nitride. All of the low refractive grid patterns 50a may have the same thickness and/or may include the same organic material. The low refraction grid pattern 50a may have a lower refractive index than the color filters CF1 and CF2. For example, the low refractive grid pattern 50a may have a refractive index of about 1.3 or less. The light blocking grid pattern 48a and the low refraction grid pattern 50a may prevent crosstalk between adjacent unit pixels UP.

The color filters CF1 and CF2 may be disposed between the low refractive grid patterns 50a in the pixel array area APS. Each of the color filters CF1 and CF2 may have one color among blue, green, and red. Alternatively or additionally, the color filters CAF1 and CF2 may include other colors such as cyan, magenta, or yellow. In the image sensor according to the present embodiment, the color filters CF1 and CF2 may be arranged in a Bayer pattern form. Alternatively or additionally, the color filters CF1 and CF2 may be arranged in one or more of a tetra pattern of a 2×2 array, a nona pattern of a 3×3 array, or a hexadeca pattern of a 4×4 array.

A capping pattern CFR may be disposed on the first low refractive index protective pattern 50b filling the inside of the first back vias BVS(1) and the second low refractive index protective pattern 50c filling the inside of the second back vias BVS(2), respectively. The capping pattern CFR may include, for example, a photoresist material.

A passivation layer 56 may be disposed or conformally disposed on the low refractive grid pattern 50a, the first conductive pattern 52a, the first metal pattern 54a, the second conductive pattern 52c, the back connection wire 52b, the first optical black pattern 52p, and the capping pattern CFR.

A second optical black pattern CFB may be disposed on the passivation layer 56. The second optical black pattern CFB may include, for example, the same material or exactly the same material as a blue color filter.

The micro lenses ML may be disposed on the color filters CF1 and CF2 in the pixel array area APS. Edges of the micro lenses ML may be in contact with and connected to each other. The micro lenses ML may constitute an array. The micro lenses ML may also be referred to as a "micro lens array."

A lens residual layer MLR may be disposed on the second optical black pattern CFB in the optical black area OB and the edge area ER. The lens residual layer MLR may include the same material as the micro lenses ML. An opening 35 exposing a back conductive pad PAD may be formed in the lens residual layer MLR and the passivation layer 56 in the pad area PR.

FIGS. 8A to 8F are cross-sectional views sequentially illustrating a method of manufacturing or fabricating an image sensor having the cross-section of FIG. 4 according to various embodiments.

Figure 8A:
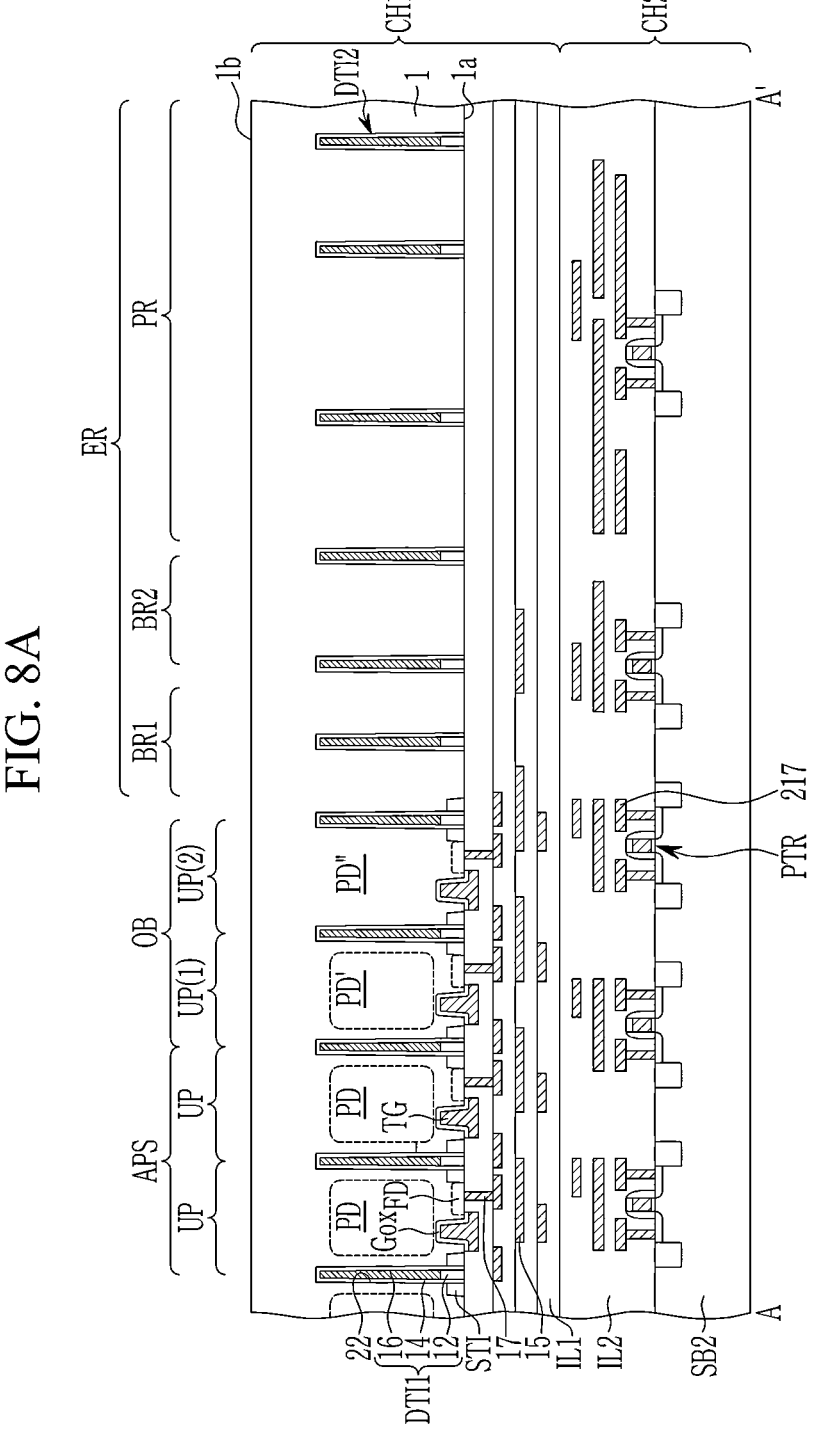
FIGS. 8A to 8F are cross-sectional views sequentially illustrating a method of manufacturing an image sensor having the cross-section of FIG. 4 according to various embodiments.

Referring to FIG. 8A, the first sub-chip CH1 is manufactured. To this end, first, an ion implantation process such as a beamline ion implantation process is performed on the first substrate 1 including the pixel array area APS, the optical black area OB and the edge area ER to form the photoelectric converter PD and the black photoelectric converter PD'. The edge area ER includes the contact area BR1, the via area BR2, and the pad area PR. The device isolator STI is formed on the front surface 1a of the first substrate 1 to define the active areas. The device isolator STI may be formed through a shallow trench isolation process. The device isolator STI and a portion of the first substrate 1 are etched to form deep trenches 22. The deep trenches 22 may define or isolate unit pixels UP in the pixel array area APS and the optical black area OB.

After forming (conformally forming) an isolation insulating layer on the front surface 1a of the first substrate 1 and filling the deep trenches 22 with a conductive material, an etch-back process and/or a chemical mechanical planarizaiton (CMP) process may be performed to form the isolation insulating patterns 14 and the isolation conductive patterns 16 within the deep trenches 22, respectively. Alternativley or additionally, the buried insulating patterns 12 may be formed on the isolation conductive patterns 16, the buried insulating layer on the front surface 1a may be removed, and the front surface 1a may be exposed. Accordingly, the first and second pixel isolators DTI1 and DTI2 may be formed at the same time.

Subsequently, a process such as a normal process such as but not limited to a normal front-end-of-line process may be performed to form a gate insulating layer Gox, the transfer gate TG, the floating diffusion region FD, the first interlayer insulating layer IL1, the first contact plugs 17, and the first wires 15 on the front surface 1a of the first substrate 1.

Referring to FIG. 8A, the second sub-chip CH2 having the structure described with reference to FIG. 4 is prepared. The first sub-chip CH1 is turned or flipped over, so the rear surface 1b faces up. After locating the first sub-chip CH1 such that the first interlayer insulating layer IL is in contact with the second interlayer insulating layer IL2, a bonding process such as a thermal compression bonding process is performed to bond the first sub-chip CH1 on the second sub-chip CH2.

Figure 8B:
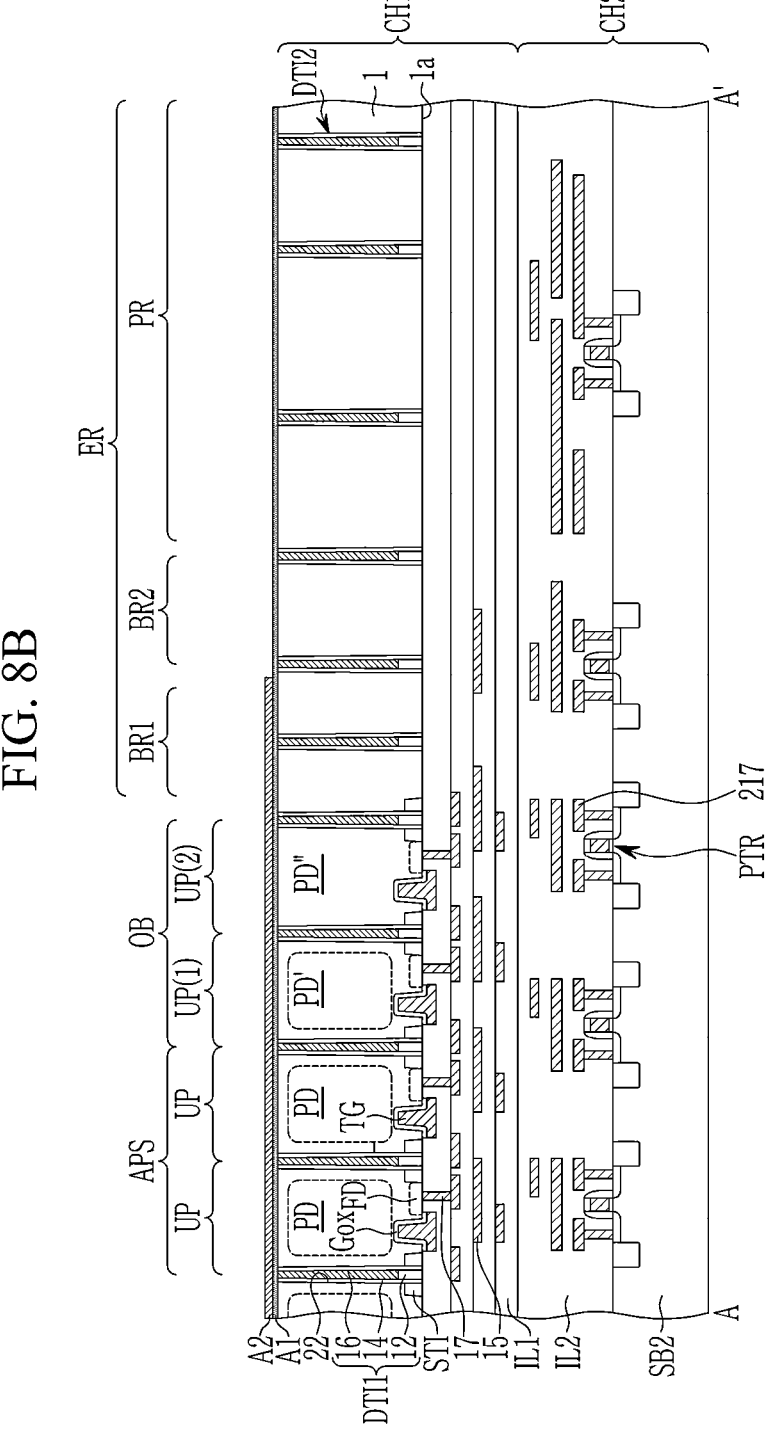

Referring to FIG. 8B, the thickness of the first substrate 1 may be reduced to a desired thickness by performing a grinding process on the rear surface 1b of the first substrate 1 in the state of FIG. 8A. In this case, the isolation conductive patterns 16 of the first and second pixel isolators DTI1 and DTI2 may be exposed.

The first insulating layer A1 and the conductive layer A2 are sequentially stacked on the rear surface 1b of the first substrate 1, and the conductive layer A2 is selectively removed and patterned such that the conductive layer A2 is disposed in the pixel array area APS, the optical black area OB, the contact area BR1, and a portion of the via area BR2, and is not disposed in the pad area PR outside thereof. The conductive layer A2 may be selectively removed by photo-etching (e.g., by a photolithographic process and an etching process), and the planar shape of the area where the first insulating layer A1 is exposed by removing the conductive layer A2 may be the same as/similar to that described with reference to FIG. 3. The first insulating layer A1 and the conductive layer A2 may be formed by one or more of atomic layer deposition (ALD), chemical vapor deposition (CVD), or physical vapor deposition (PVD), respectively. The first insulating layer A1 may be made of aluminum oxide and may have a first thickness T1 as illustrated in FIG. 7. The conductive layer A2 may be made of titanium oxide and may have a second thickness T2.

Figure 8C:
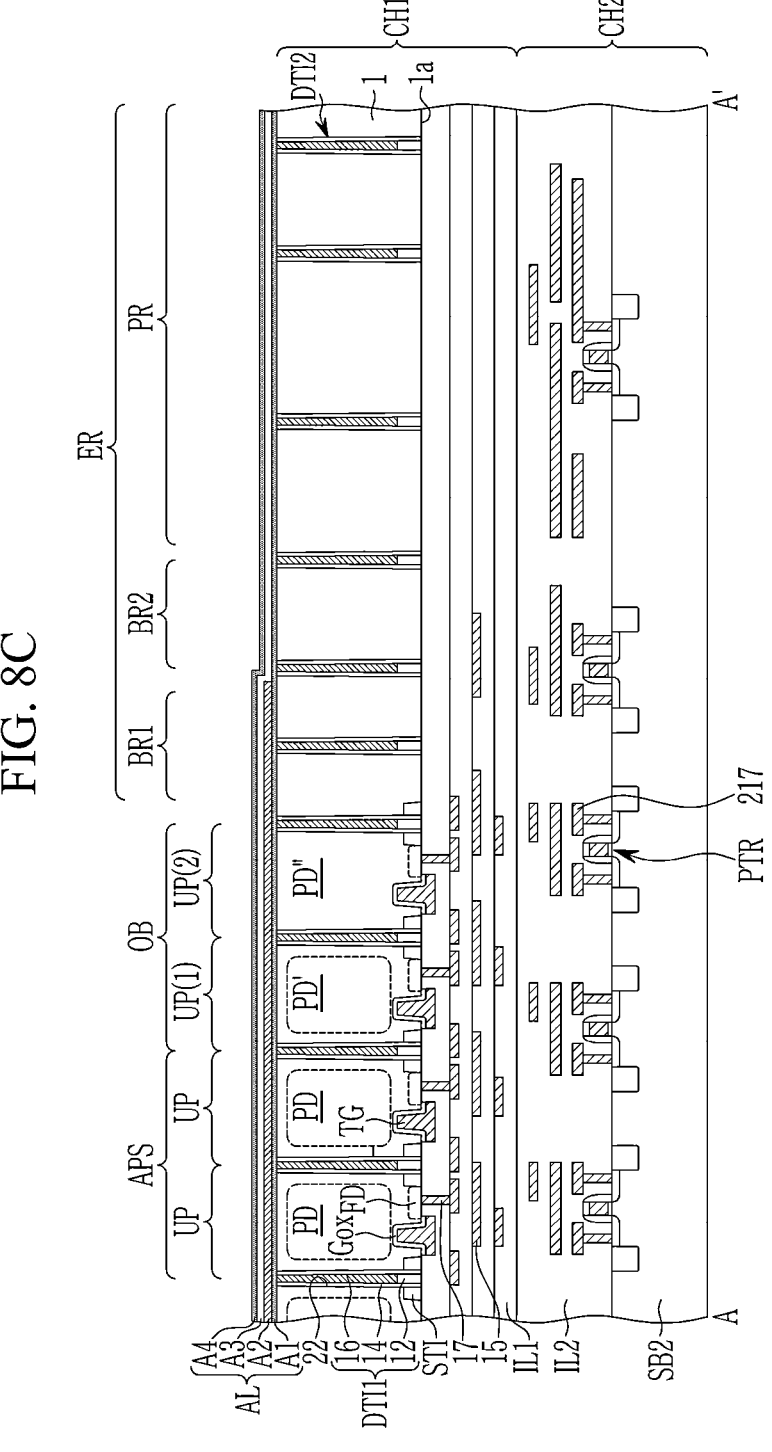

Referring to FIG. 8C, the second insulating layer A3 and the third insulating layer A4 are sequentially stacked on the first insulating layer A1 and the conductive layer A2. The second insulating layer A3 may be made of silicon oxide and may have a third thickness T3 as illustrated in FIG. 7. The third insulating layer A4 may be formed of hafnium oxide and may have a fourth thickness T4 as illustrated in FIG. 7.

Figure 8D:
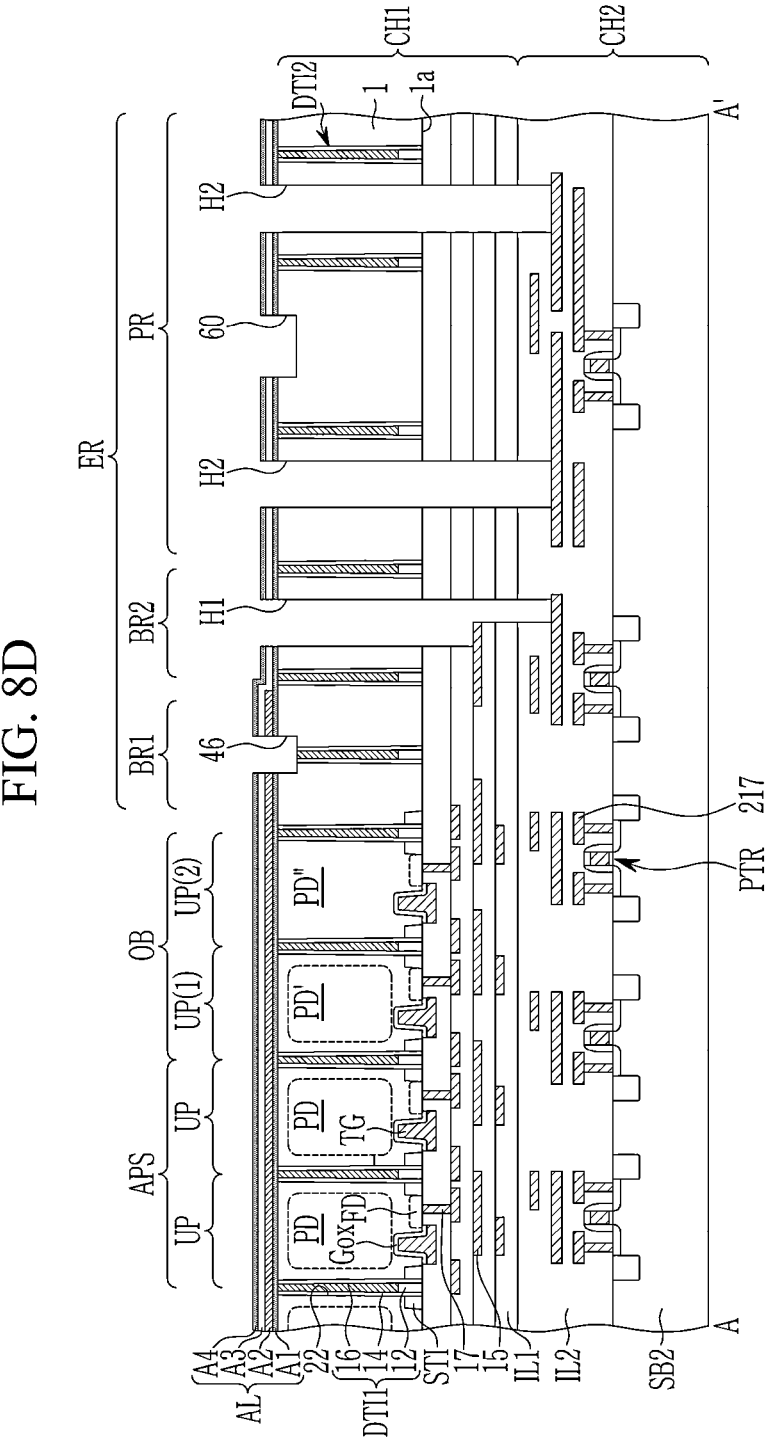

Referring to FIG. 8D, the anti-reflection structure AL and the predetermined portion of the first substrate 1 are etched in the edge area ER to form the first back trench 46 and the second back trench 60. When the first back trench 46 is formed, the first pixel isolator DTI1 may be partially etched to expose the isolation conductive pattern 16 of the first pixel isolator DTI1. In the edge area ER, the anti-reflection structure AL, the first substrate 1, the first interlayer insulating layer IL1, and the second interlayer insulating layer IL2 are partially etched to form the first and second holes H1 and H2.

Figure 8E:
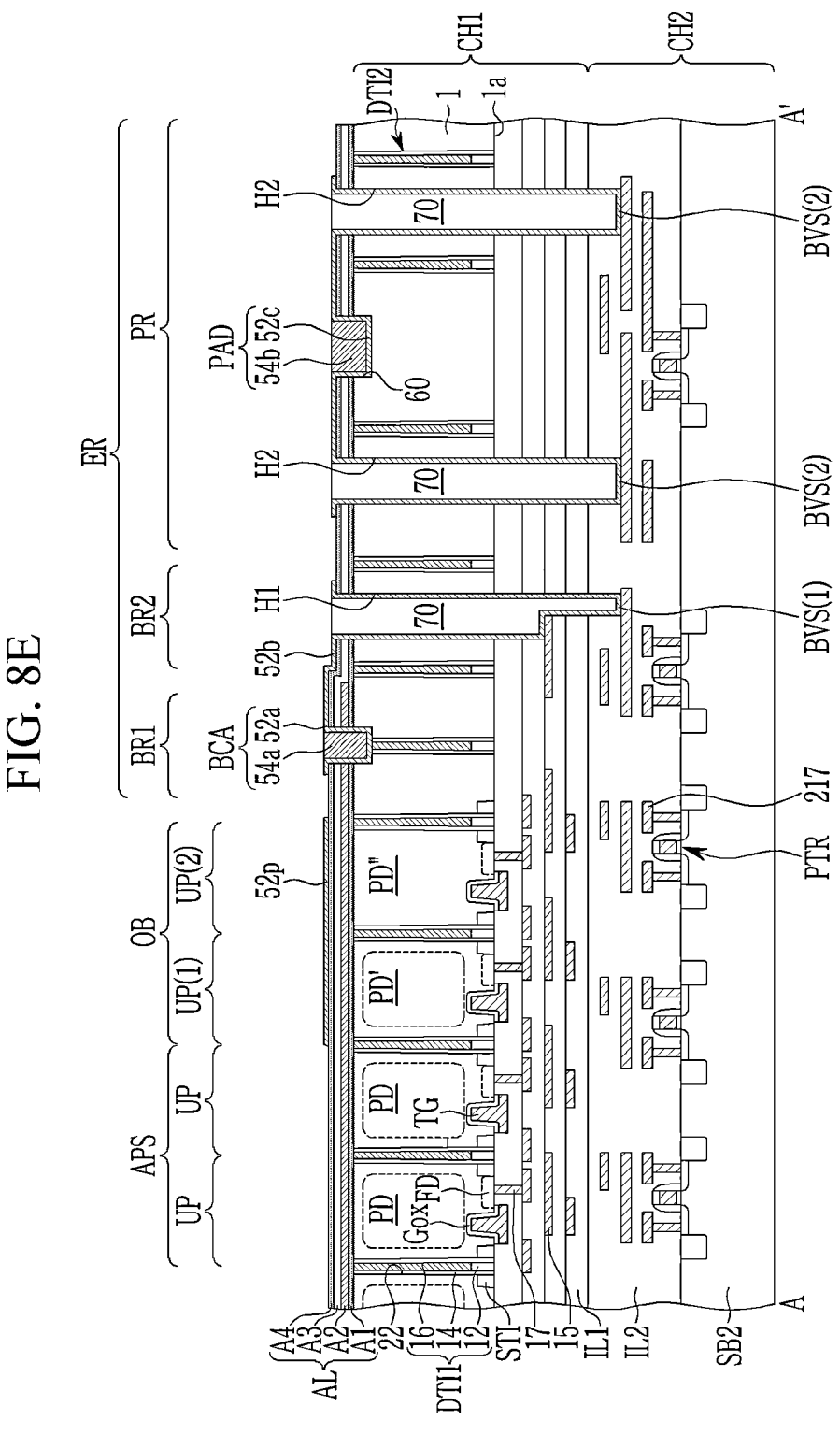

Referring to FIG. 8E, a conductive film is stacked (e.g., conformally stacked) on the rear surface 1b of the first substrate 1 and then etched to form the first conductive patterns 52a, the second conductive patterns 52c, and the back connection wire 52b, the first optical black pattern 52p, and the first and second back vias BVS(1) and BVS(2). When the conductive film is etched, the third insulating layer A4 may function as an etch stop layer. After filling the first and second holes H1 and H2 with the sacrificial film 70 and covering unwanted areas with a mask pattern (not illustrated), an electroplating or deposition process is performed to form the first metal pattern 54a and the second metal pattern 54b filling the first back trench 46 and the second back trench 60, respectively. As a result, the back contacts BCA and the back conductive pads PAD may be formed.

Figure 8F:
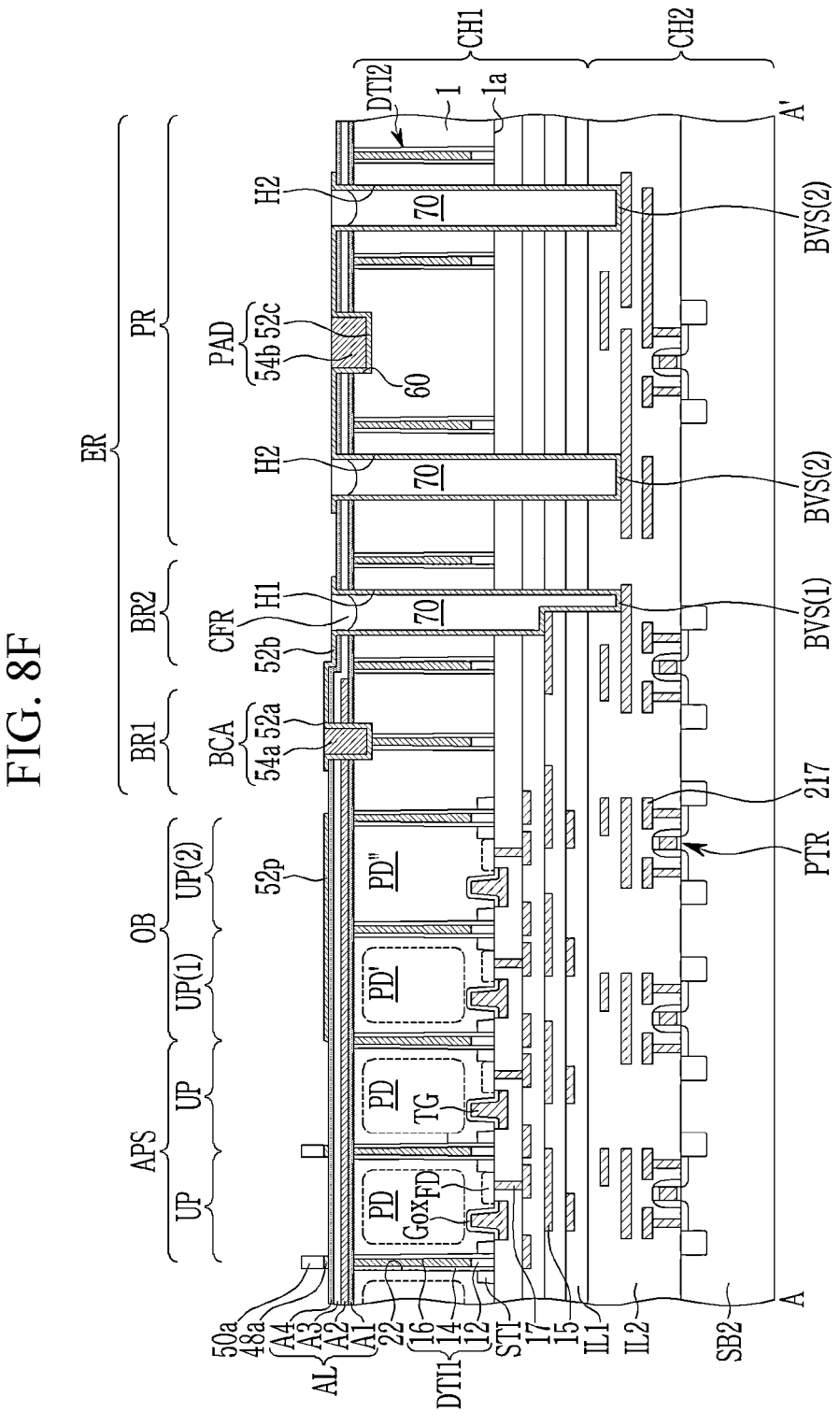

Referring to FIG. 8F, a light blocking film and a low refractive index film are sequentially conformally stacked on the rear surface 1b of the first substrate 1 and then etched to form the light blocking grid pattern 48a and the low refractive grid pattern 50a. When the light blocking film and the low refractive index film are etched, the third insulating layer A4 may function as the etch stop layer. The capping pattern CFR filling the upper portions of the first and second back vias BVS(1) and BVS(2) may be formed.

Referring back to FIG. 4, the passivation layer 56 is conformally formed on the rear surface 1b of the first substrate 1. The color filters CF1 and CF2 and the second optical black pattern CFB may be formed through a normal process. The second optical black pattern CFB may be formed simultaneously with forming the blue color filter. Further, the micro lenses ML and the lens residual layer MLR may be formed on the color filters CF1 and CF2 and the second optical black pattern CFB. Subsequently, the opening 35 exposing the back conductive pad PAD may be formed in the lens residual layer MLR and the passivation layer 56 in the pad area PR.

Figure 9:
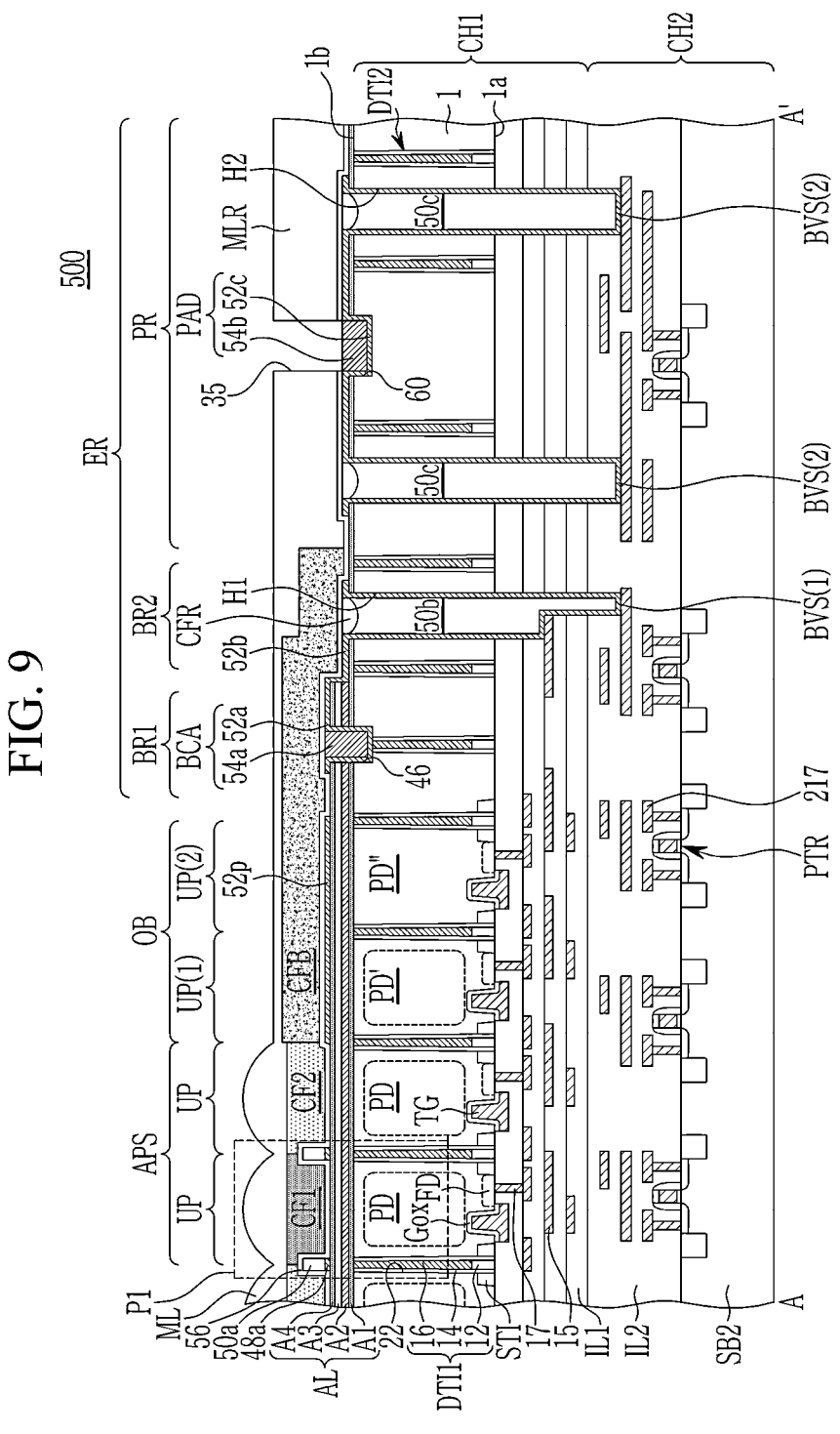
FIG. 9 is a cross-sectional view of an image sensor according to various embodiments.

FIG. 9 is a cross-sectional view of an image sensor according to various embodiments.

Embodiments illustrated in FIG. 9 may be different from the embodiment of FIG. 4 in that the second insulating layer A3 and the third insulating layer A4 of the anti-reflection structure AL are patterned to have the same planar shape as the conductive layer A2. For example, the second insulating layer A3 and the third insulating layer A4 may have edges that substantially coincide with the conductive layer A2. Herein, substantially coinciding indicates coinciding to the extent that it includes errors introduced by differences in etch rates when forming these three layers by simultaneous photoetching.

In some embodiments, in the structure of FIG. 4, only the second insulating layer A3 may be patterned to have the same planar shape as the conductive layer A2, and the third insulating layer A4 may be disposed over all of the pixel array area APS, optical black area OB, and edge area ER similar to the first insulating layer A1. That is, the second insulating layer A3 may have an edge substantially coinciding with the conductive layer A2, and the third insulating layer A4 may have an edge substantially coinciding with the first insulating layer A1.

Figure 10:
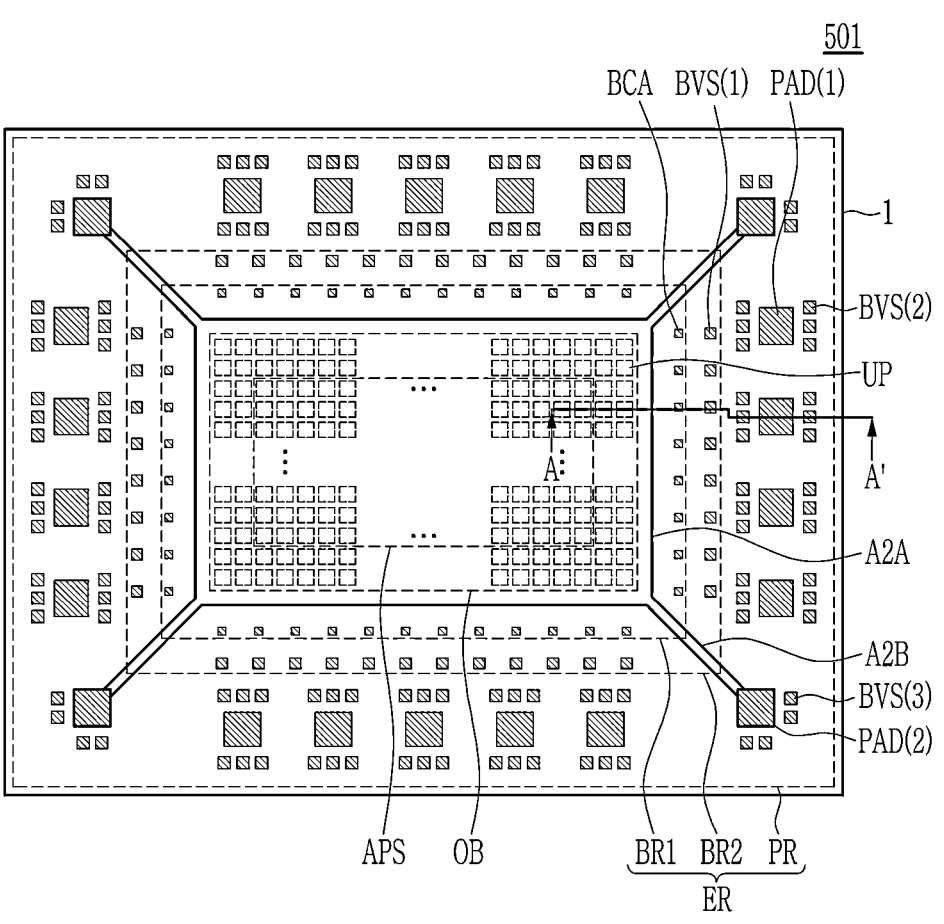
FIG. 10 is a plan view of an image sensor according to various embodiments.
Figure 11:
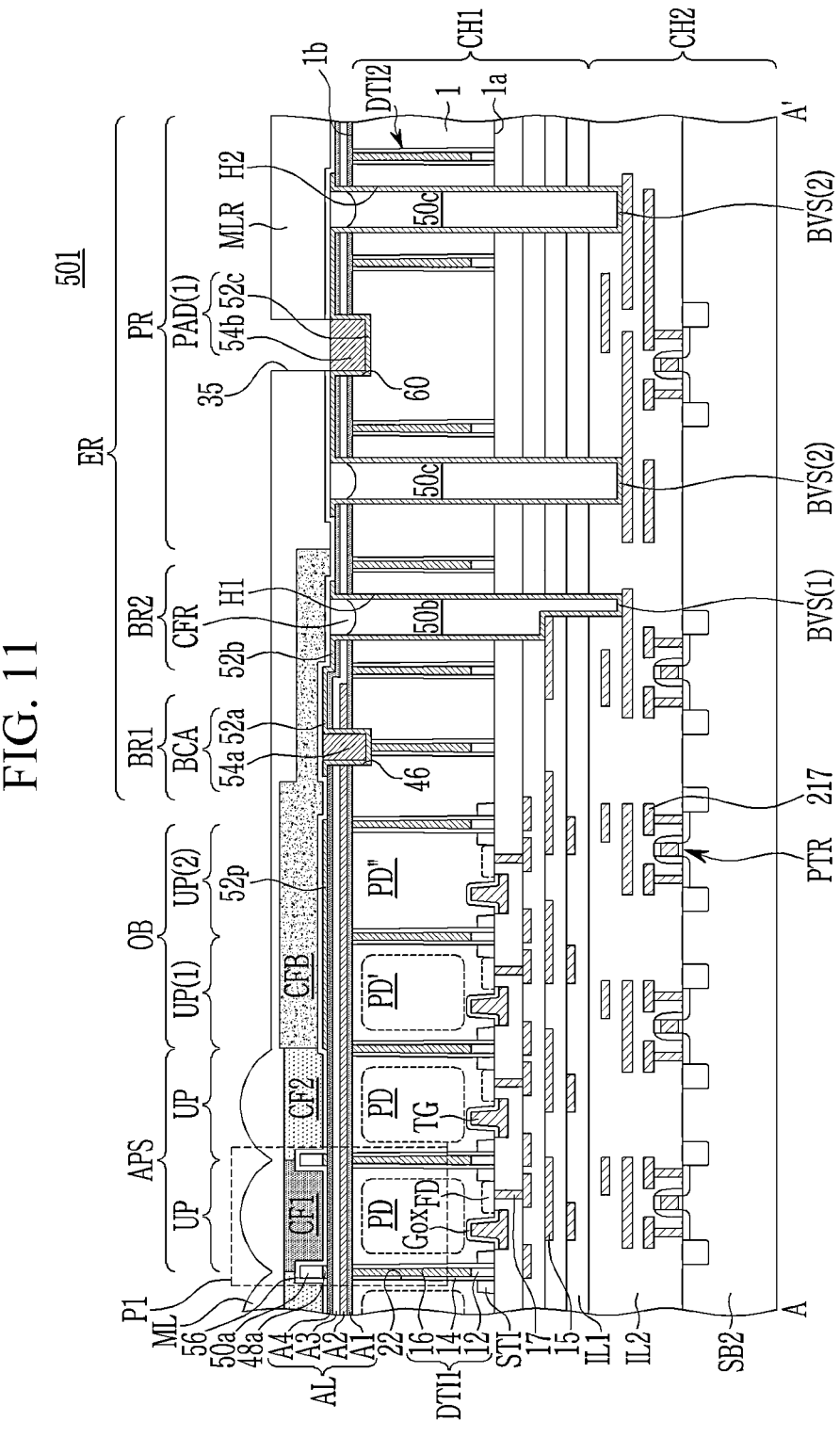
FIG. 11 is a cross-sectional view taken along line A-A' of FIG. 9.

FIG. 10 is a plan view of an image sensor according to various embodiments. FIG. 11 is a cross-sectional view taken along the line A-A' of FIG. 10.

The image sensor 501 according to embodiments illustrated in FIGS. 10 and 11, compared to the image sensor 500 according to embodiments illustrated in FIGS. 3 and 4, has a conductive layer A2 of the anti-reflection structure AL that comprises a main body part A2A and a connection part A2B extending from the main body part A2A to the pad area PR. The image sensor 501 further comprises second conductive pads PAD(2) that are connected to the connection part A2B, and a third back vias BVS(3) that is electrically connected to the second conductive pads PAD(2). The connection structure between the second conductive pads PAD(2) and the third back vias BVS(3) may be the same as the connection structure between the back contacts BCA and the first back vias BVS(1) in the embodiment of FIG. 4. The connection structure between the second conductive pads PAD (2) and the conductive layer A2 may be the same as the connection structure between the back contacts BCA and the conductive layer A2 in the embodiment of FIG. 4. Other configurations may be the same as or similar to those of the embodiments of FIGS. 3 and 4.

Referring to FIGS. 10 and 11, the conductive layer A2 may include the main body part A2A that is disposed in the pixel array area APS and the front surface of the optical black area OB, and the connection part A2B that is disposed in the contact area BR1, the via area BR2, and the pad area PR. The connection part A2B may be arranged to reach the second conductive pads PAD(2) through areas in which the back contacts BCA, the first back vias BVS(1), the second back vias BVS(2), and the first conductive pads PAD(1) are not disposed. Only the first insulating layer A1, the second insulating layer A3, and the third insulating layer A4 may be disposed in portions other than the portion where the connection part A2B is disposed in the contact area BR1, the via area BR2, and the pad area PR. In some embodiments, the first insulating layer A1 may also be removed in the area where the conductive layer A2 is not disposed. In some embodiments, the second insulating layer A3 may also be removed in the area where the conductive layer A2 is not disposed. In some embodiments, the second insulating layer A3 and the third insulating layer A4 may also be removed in the area where the conductive layer A2 is not disposed.

In some embodiments, the second conductive pads PAD (2) are disposed at four corners of the image sensor, and the four connection parts A2B are disposed to connect between the four corners of the main body part A2A and the second conductive pads PAD(2), but the number or arrangement position of the connection parts A2B may vary depending on various embodiments. The second conductive pads PAD(2), the third back vias BVS(3) and the connection parts A2B may be in various arrangements, as long as they are not electrically connected to the back contacts BCA, first back vias BVS(1), second back vias BVS(2), and first conductive pads PAD(1).

In some embodiments, a negative potential such as a dynamically determined or predetermined negative potential may be applied to the main body part A2A through the third back vias BVS(3), the second conductive pads PAD(2), and the connection part A2B. As a result, holes may be accumulated in the vicinity of the rear surface 1b of the first substrate 1. As a result, it may be possible to improve the dark current and the white spot. In some embodiments, the third back vias BVS(3) may be omitted and the second conductive pad PAD(2) may be connected to an external terminal to apply a negative potential.

Figure 12:
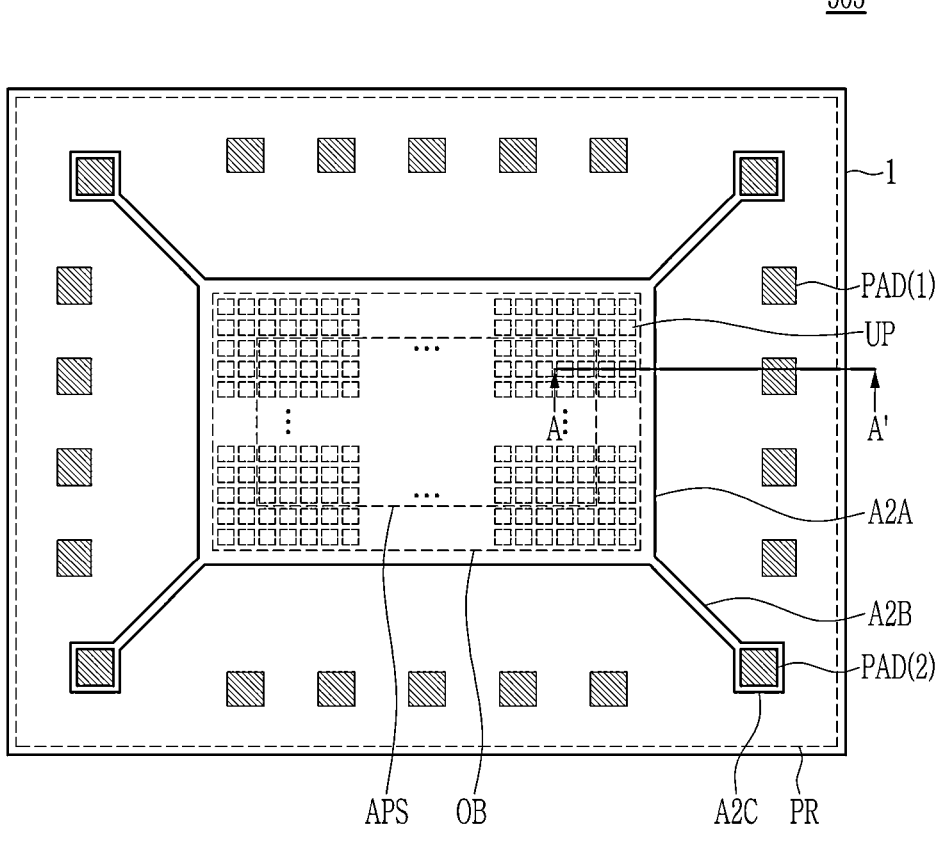
FIG. 12 is a plan view of an image sensor according to various embodiments.
Figure 13:
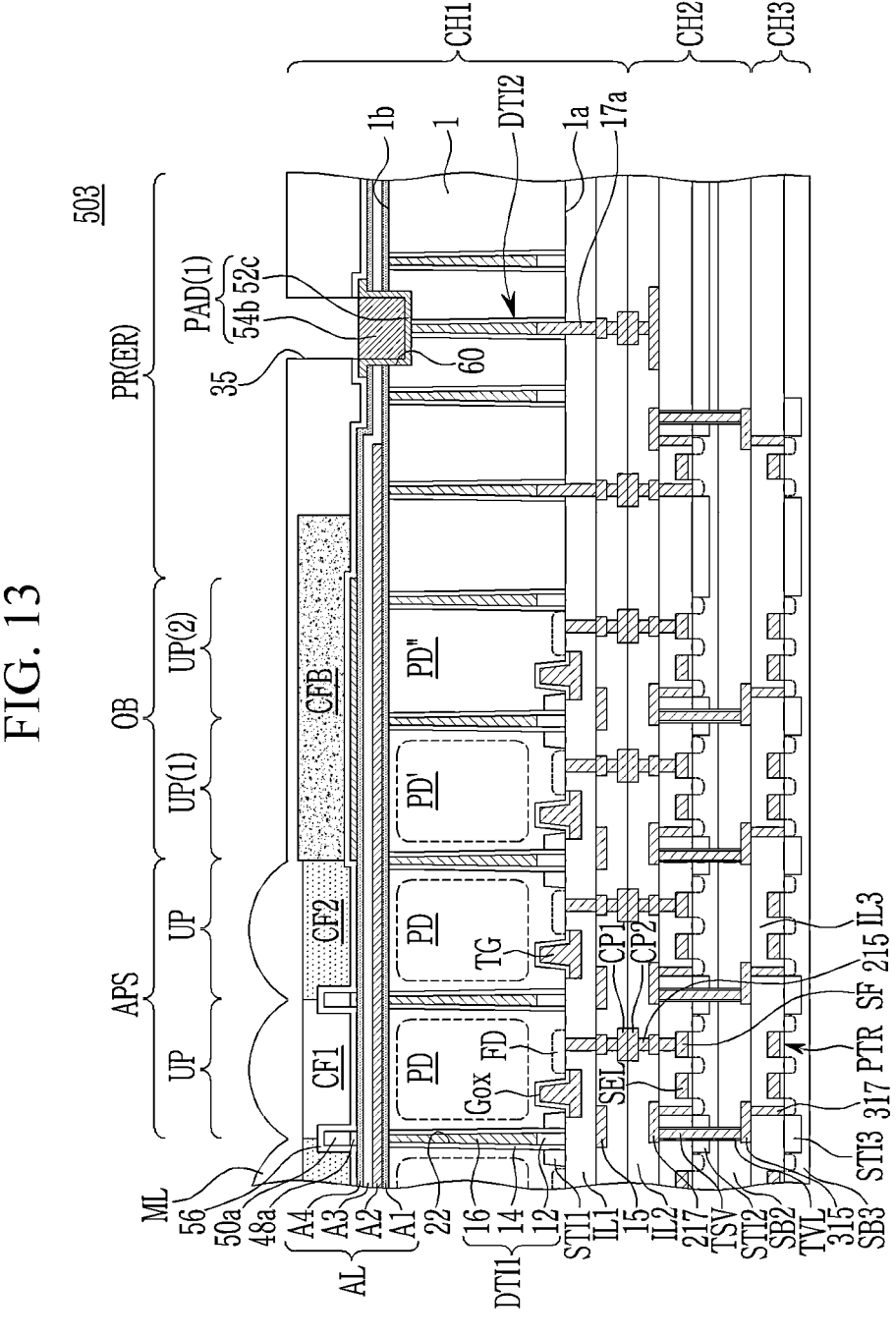
FIG. 13 is a cross-sectional view taken along line A-A' of FIG. 11.

FIG. 12 is a plan view of an image sensor according to various embodiments, and FIG. 13 is a cross-sectional view taken along line A-A' of FIG. 12.

The image sensor 503 according to the embodiment of FIGS. 12 and 13 may be different from the image sensor 501 according to the embodiments of FIGS. 10 and 11 in that it has a structure in which the first to third sub-chips CH1 to CH3 are sequentially bonded.

The first sub-chip CH1 may perform an image sensing function. The first sub-chip CH1 may include the transfer gates TG on the front surface 1a of the first substrate 1 and the first interlayer insulating layers IL1 covering the transfer gates TG. A first device isolator STI1 is disposed on the first substrate 1 to define the active areas. The first sub-chip CH1 may not include the back contacts BCA and the back vias BVS. The first sub-chip CH1 may further include internal connection contacts 17a. At least one of the internal connection contacts 17a may penetrate through the buried insulating pattern 12 of the first pixel isolator DTI1 in the edge area ER to connect some of the first wires 15 to the isolation conductive pattern 16 of the first pixel isolator DTI1, and the negative bias voltage may be applied to the isolation conductive pattern 16. At least another one of the internal connection contacts 17a penetrates through the buried insulating pattern 12 of the second pixel isolator DTI2 under the first conductive pad PAD(1) to connect some of the first wires 15 to the isolation conductive pattern 16 of the second pixel isolator DTI2. The first bonding conductive pad CP1 may be disposed within the lowermost first interlayer insulating layer IL1. The first bonding conductive pad CP1 may include copper.

The second sub-chip CH2 includes the second substrate SB2, the select gates SEL, the source-follower gates SF, and the reset gates (not illustrated) disposed on the second substrate SB2, and the second interlayer insulating layers IL2 covering them. A second device isolator STI2 is disposed on the second substrate SB2 to define the active areas. The second contacts 215 and the second wires 217 may be disposed in the second interlayer insulating layers IL2. The second bonding conductive pad CP2 may be disposed in the uppermost second interlayer insulating layer IL2. The second bonding conductive pad CP2 may include copper. The second bonding conductive pad CP2 may be in contact with the first bonding conductive pad CP1. The source-follower gates SF may be connected to the floating diffusion regions FD of the first sub-chip CH1, respectively.

The third sub-chip CH3 may include a third substrate SB3, peripheral transistors PTR disposed thereon, and third interlayer insulating layers IL3 covering them. A third device isolator STI3 is disposed on the third substrate SB3 to define the active areas. Third contacts 317 and third wires 315 may be disposed in the third interlayer insulating layers IL3. The uppermost third interlayer insulating layer IL3 is in contact with the second substrate SB2. A through electrode TSV may penetrate through the second interlayer insulating layer IL2, the second device isolator STI2, and the second substrate SB2 to connect one of the second wires 217 and one of the third wires 315. A sidewall of the through electrode TSV may be surrounded by a via insulating layer TVL. The third sub-chip CH3 may include circuits for driving the first and/or second sub-chips CH1 and CH2 or storing electrical signals generated by the first and/or second sub-chips CH1 and CH2.

In some embodiments illustrated in FIGS. 12 and 13, the internal connection contacts 17a and the isolation conductive patterns 16 of the first and second pixel isolators DTI1 and DTI2 may replace the first back vias BVS(1), the second back vias BVS(2), and the third back vias BVS(3). Therefore, the negative voltage may be applied to the conductive layer A2 through the internal connection contacts 17a, the isolation conductive patterns 16 of the second pixel isolator DTI2, the second conductive pad PAD(2), and the connection part A2B. In some embodiments, the second conductive pads PAD(2) may be connected to the external terminal to receive the predetermined negative potential. Alternatively or additionally, the conductive layer A2 may have a pad base part A2C in addition to the main body part A2A and the connection part A2B. The pad base part A2C may be formed wider than the connection part A2B so that the second conductive pads PAD(2) may be disposed thereon. The pad base part A2C may also be applied to the embodiment of FIGS. 10 and 11.

In some embodiments, the second conductive pads PAD (2) are disposed at four corners of the image sensor, and the four connection parts A2B are disposed to connect between the four corners of the main body part A2A and the second conductive pads PAD(2), but the number or arrangement position of the connection parts A2B may vary depending on various embodiments. The second conductive pads PAD(2) and the connection part A2B may be arranged in various ways, as long as they are not electrically connected to the first conductive pads PAD(1).

Any or all of the elements described with reference to FIG. 1 may communicate with any or all other elements described with reference to FIG. 1. For example, any element may engage in one-way and/or two-way and/or broadcast communication with any or all other elements in FIG. 1, to transfer and/or exchange and/or receive information such as but not limited to data and/or commands, in a manner such as in a serial and/or parallel manner, via a bus such as a wireless and/or a wired bus (not illustrated). The information may be in encoded various formats, such as in an analog format and/or in a digital format.

Although some embodiments has been described with reference to the accompanying drawings, those of ordinary skill in the art will appreciate that various modifications and alterations may be made without departing from the spirit or essential feature of the example disclosure. Therefore, it should be understood that the above-mentioned embodiments are examples in all aspects but are not limited thereto. Embodiments of FIGS. 3 to 12 may be combined with each other, and are not necessarily mutually exclusive with one another.

What is claimed is:

1. An image sensor, comprising:
   a first substrate that has a first surface and a second surface opposite to the first surface, and includes a pixel array area and an edge area, the edge area including first conductive pad;
   an anti-reflection structure on the second surface;
   a pixel isolator in the first substrate defining and separating pixels; and
   a micro lens array on the anti-reflection structure,
   wherein the anti-reflection structure includes a first insulating layer, a conductive layer, a second insulating layer, and a third insulating layer that are sequentially stacked, the conductive layer is on the pixel array area, and is not at least in a portion of the edge area where the first conductive pad is, and
the conductive layer is configured to receive a voltage.

2. The image sensor of claim 1, wherein:
the first insulating layer includes aluminum oxide,
the second insulating layer includes silicon oxide,
the third insulating layer includes hafnium oxide, and
the conductive layer includes titanium oxide.

3. The image sensor of claim 1, wherein:
the first substrate has a first refractive index,
the first insulating layer has a second refractive index,
the conductive layer has a third refractive index,
the second insulating layer has a fourth refractive index, and
an average value of the second refractive index and the third refractive index is less than the first refractive index and is greater than the fourth refractive index.

4. The image sensor of claim 1, further comprising:
a contact on the second surface of the first substrate and in the edge area,
wherein the conductive layer is electrically connected to the contact.

5. The image sensor of claim 4, wherein,
the pixel isolator includes an isolation conductive pattern and an isolation insulating pattern interposed between the isolation conductive pattern and the first substrate, and
the pixel isolator extends to the edge area, and the contact passes through a portion of the first substrate and contacts the isolation conductive pattern of the pixel isolator.

6. The image sensor of claim 4, further comprising:
a first interlayer insulating layer on the first surface of the first substrate;
a first wire within the first interlayer insulating layer;
a second interlayer insulating layer under the first interlayer insulating layer;
a second wire within the second interlayer insulating layer;
a second substrate under the second interlayer insulating layer; and
a first via and a second via, the first via and second via partially penetrating through the first substrate, the first interlayer insulating layer, and the second interlayer insulating layer, and that contact at least one of the first wire and the second wire.

7. The image sensor of claim 6, further comprising:
a connection wire that connects between the first via and the contact,
wherein the voltage is configured to be applied to the conductive layer through the first via and the contact.

8. The image sensor of claim 7, wherein an edge of the conductive layer is disposed between the contact and the first via.

9. The image sensor of claim 6, wherein an edge of the conductive layer is disposed between the contact and the first via.

10. The image sensor of claim 9, wherein
the first insulating layer, the second insulating layer, and the third insulating layer are arranged across the pixel array area and the edge area, and
the conductive layer is only in the pixel array area and a portion of the edge area.

11. The image sensor of claim 1, further comprising:
a second conductive pad on the second surface of the first substrate in the edge area, wherein the conductive layer includes a main body part on the pixel array area and a connection part connecting the main body part and the second conductive pad.

12. The image sensor of claim 11, further comprising:
a first interlayer insulating layer on the first surface of the first substrate;
a first wire within the first interlayer insulating layer;
a second interlayer insulating layer under the first interlayer insulating layer;
a second wire within the second interlayer insulating layer;
a second substrate under the second interlayer insulating layer; and
a first via, a second via, and a third via, the first via, the second via, and the third via partially penetrating through the first substrate, the first interlayer insulating layer, and the second interlayer insulating layer, and that contact at least one of the first wire and the second wire,
wherein the third via is electrically connected to the second conductive pad, and the voltage is configured to be applied to the conductive layer through the third via and the second conductive pad.

13. The image sensor of claim 11, further comprising:
a contact on the second surface of the first substrate in the edge area, wherein the pixel isolator includes an isolation conductive pattern and an isolation insulating pattern interposed between the isolation conductive pattern and the first substrate, and
the pixel isolator extends to the edge area, and the contact passes through a portion of the first substrate and contacts the isolation conductive pattern of the pixel isolator.

14. The image sensor of claim 13, wherein an edge of the main body part is between the pixel array area and the contact and is separated from the contact.

15. The image sensor of claim 11, wherein the pixel isolator includes an isolation conductive pattern and a buried insulating pattern,
wherein the image sensor further includes:
a first interlayer insulating layer that is disposed on the first surface of the first substrate, the buried insulating pattern interposed between the isolation conductive pattern and the first interlayer insulating layer;
a first wire that is disposed within the first interlayer insulating layer;
an internal connection contact that penetrates through the buried insulating pattern and connects the first wire and the isolation conductive pattern;
a second interlayer insulating layer that is disposed under the first interlayer insulating layer;
a second wire that is disposed within the second interlayer insulating layer; and
a second substrate that is disposed under the second interlayer insulating layer, and
wherein the second conductive pad is connected to the isolation conductive pattern connected to the internal connection contact.

16. The image sensor of claim 1, wherein:
the first insulating layer is disposed over the pixel array area and the edge area, and
the second insulating layer and the third insulating layer have edges substantially coinciding with the conductive layer.

17. An image sensor, comprising:
a first substrate that has a first surface and a second surface opposite to the first surface, and that includes a pixel array area and an edge area;
an anti-reflection structure on the second surface;
a pixel isolator on the first substrate defining and separating pixels;
a color filter on the anti-reflection structure;
a micro lens array on the color filter;
a first interlayer insulating layer on the first surface of the first substrate;
a first wire within the first interlayer insulating layer;
a second interlayer insulating layer under the first interlayer insulating layer;
a second wire within the second interlayer insulating layer;
a second substrate under the second interlayer insulating layer;
a contact on the second surface of the first substrate in the edge area;
a conductive pad on the second surface of the first substrate in the edge area and at a position farther from the pixel array area than the contact; and
a first via and a second via, the first via and the second via partially passing through the first substrate, the first interlayer insulating layer, and the second interlayer insulating layer in the edge area, and contact at least one of the first wire and the second wire,
wherein the anti-reflection structure includes a first insulating layer, a titanium oxide layer, a second insulating layer, and a third insulating layer sequentially stacked, and
an edge of the titanium oxide layer is between the contact and the conductive pad, and the titanium oxide layer is electrically connected to the contact.

18. The image sensor of claim 17, wherein:
the first via is electrically connected to the contact, and the second via is electrically connected to the conductive pad, and
a negative voltage is configured to be applied to the titanium oxide layer through the first via and the contact.

19. An image sensor, comprising:
a first substrate that has a first surface and a second surface opposite to the first surface, and that includes a pixel array area and an edge area;
an anti-reflection structure on the second surface;
a pixel isolator on the first substrate defining and separating pixels;
a color filter on the anti-reflection structure;
a micro lens array on the color filter;
a first interlayer insulating layer on the first surface of the first substrate;
a first wire within the first interlayer insulating layer;
a second interlayer insulating layer under the first interlayer insulating layer;
a second wire within the second interlayer insulating layer;
a second substrate under the second interlayer insulating layer; and
a first conductive pad and a second conductive pad that are on the second surface of the first substrate in the edge area,
wherein the anti-reflection structure includes a first insulating layer, a titanium oxide layer, a second insulating layer, and a third insulating layer sequentially stacked,
the titanium oxide layer includes a main body part having an edge between the pixel array area and the first conductive pad and a connection part connecting between the main body part and the second conductive pad, and the connection part is electrically connected to the second conductive pad.

20. The image sensor of claim 19, further comprising:

a contact on the second surface of the first substrate in the edge area, and a first via, a second via, and a third via, the first via, the second via, and the third via partially penetrating through the first substrate, the first interlayer insulating layer, and the second interlayer insulating layer, and that contact at least one of the first wire and the second wire, wherein the first via is electrically connected to the contact, the second via is electrically connected to the first conductive pad, and the third via is electrically connected to the second conductive pad, and a negative voltage is configured to be applied to the titanium oxide layer through the third via and the second conductive pad.

* * * * *